United States Patent
Chen et al.

(10) Patent No.: US 10,943,526 B2
(45) Date of Patent: Mar. 9, 2021

(54) DISPLAY DEVICE, BACKLIGHT MODULE AND ELECTRONIC DEVICE

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW); Yuan-Lin Wu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/051,396

(22) Filed: Jul. 31, 2018

(65) Prior Publication Data

US 2020/0043400 A1 Feb. 6, 2020

(51) Int. Cl.
*G09G 3/22* (2006.01)
*H01L 33/08* (2010.01)

(52) U.S. Cl.
CPC .............. *G09G 3/22* (2013.01); *H01L 33/08* (2013.01); *G09G 2310/0264* (2013.01)

(58) Field of Classification Search
CPC ...... G09G 3/30; G09G 3/3208; G09G 3/3233; G09G 3/22; G09G 2310/0264; G09G 3/32; H01L 33/08
See application file for complete search history.

(56) References Cited

U.S. PATENT DOCUMENTS

| | | | | |
|---|---|---|---|---|
| 5,644,370 A | * | 7/1997 | Miyawaki | G02F 1/13454 349/43 |
| 2001/0020705 A1 | | 9/2001 | Miyata | |
| 2004/0256620 A1 | * | 12/2004 | Yamazaki | G09G 3/3233 257/66 |
| 2006/0244696 A1 | | 11/2006 | Jung | |
| 2007/0176176 A1 | * | 8/2007 | Yamazaki | H01L 27/1222 257/59 |
| 2010/0238094 A1 | * | 9/2010 | Cho | G09G 3/3208 345/82 |
| 2012/0153293 A1 | * | 6/2012 | Koyama | G09G 3/3225 257/72 |
| 2014/0061612 A1 | * | 3/2014 | Yamazaki | H01L 51/5243 257/40 |
| 2016/0351092 A1 | * | 12/2016 | Chen | G09G 3/3233 |
| 2018/0006273 A1 | * | 1/2018 | Kim | H01L 27/326 |

(Continued)

FOREIGN PATENT DOCUMENTS

CN 108321169 A 7/2018

*Primary Examiner* — Kent W Chang
*Assistant Examiner* — Sujit Shah
(74) *Attorney, Agent, or Firm* — Winston Hsu

(57) ABSTRACT

A display device includes a substrate, a driving circuit structure and at least one light emitting device. The driving circuit structure is disposed on the substrate and has at least one driving thin film transistor. The at least one light emitting device has a first connecting post and a second connecting post thereby being disposed on the driving circuit structure, and the at least one light emitting device is electrically connected to the at least one driving thin film transistor through the first connecting post. The at least one driving thin film transistor includes a channel layer, and a distance between the first connecting post and the second connecting post is greater than a channel length of the channel layer.

20 Claims, 22 Drawing Sheets

(56) References Cited

U.S. PATENT DOCUMENTS

2018/0033768 A1 2/2018 Kumar
2018/0040774 A1 2/2018 Lee
2018/0150167 A1* 5/2018 Hong .................... G06F 3/0412
2019/0172761 A1 6/2019 Guo

* cited by examiner

DISPLAY DEVICE, BACKLIGHT MODULE AND ELECTRONIC DEVICE

BACKGROUND OF THE DISCLOSURE

1. Field of the Disclosure

The present disclosure relates to an electronic device, and more particularly to an electronic device having a driving thin film transistor to drive a light emitting device.

2. Description of the Prior Art

As the evolution and development of electronic devices, the electronic devices are widely used and have become an indispensable item in these days. For example, a display device, which is a kind of the electronic devices, has the characteristics of thin appearance, light weight, low power consumption and low radiation pollution, and it has been used in such as televisions, monitor, notebooks, smart phones, watches, and display devices in vehicles, so as to transmit and display information more conveniently. In general, the electronic device may have a light emitting device, such as light-emitting diode (LED), to emit light. However, the driving performance of the light emitting device needs to be improved in order to reduce the cost.

SUMMARY OF THE DISCLOSURE

According to an embodiment, the present disclosure provides a display device including a substrate, a driving circuit structure and at least one light emitting device. The driving circuit structure is disposed on the substrate and has at least one driving thin film transistor. The at least one light emitting device has a first connecting post and a second connecting post thereby being disposed on the driving circuit structure, and the at least one light emitting device is electrically connected to the at least one driving thin film transistor through the first connecting post. The at least one driving thin film transistor includes a channel layer, and a distance between the first connecting post and the second connecting post is greater than a channel length of the channel layer.

According to another embodiment, the present disclosure provides a backlight module including a substrate, a driving circuit structure and at least one light emitting device. The driving circuit structure is disposed on the substrate and has at least one driving thin film transistor. The at least one light emitting device has a first connecting post and a second connecting post thereby being disposed on the driving circuit structure, and the at least one light emitting device is electrically connected to the at least one driving thin film transistor through the first connecting post. The at least one driving thin film transistor includes a channel layer, and a distance between the first connecting post and the second connecting post is greater than a channel length of the channel layer.

According to still another embodiment, the present disclosure provides an electronic device including a substrate, a driving circuit structure and at least one light emitting device. The driving circuit structure is disposed on the substrate and has at least one driving thin film transistor. The at least one light emitting device has a first connecting post and a second connecting post thereby being disposed on the driving circuit structure, and the at least one light emitting device is electrically connected to the at least one driving thin film transistor through the first connecting post. The at least one driving thin film transistor includes a channel layer, and a distance between the first connecting post and the second connecting post is greater than a channel length of the channel layer.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of an electronic device ED, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

When the corresponding component such as layer or area is referred to "on another component (or the variant thereof)" or "extend to another component", it may be directly on another component or directly extend to another component, or other component may exist between them. On the other hand, when the component is referred to "directly on another component (or the variant thereof)" or "directly extend to another component", any component does not exist between them.

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented. In addition, when the component is referred to "be coupled to/with another component (or the variant thereof)", it may be directly connected to another component, or may be indirectly connected (such as electrically connected) to another component through other component or components.

It should be noted that the technical features in different embodiments described in the following can be replaced, recombined, or mixed with one another to constitute another embodiment without departing from the spirit of the present disclosure.

Figure 1:
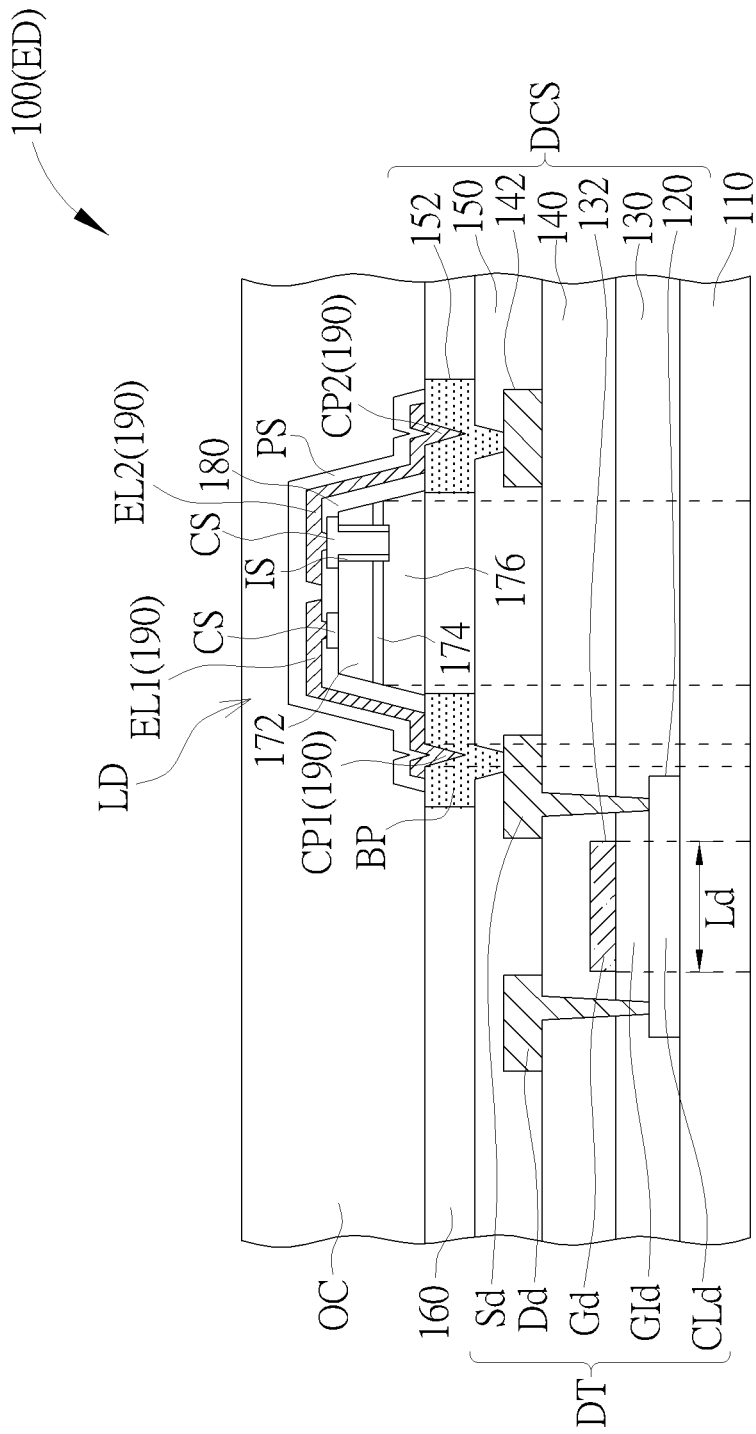
FIG. 1 is a schematic diagram showing a cross-sectional view of a substrate structure of an electronic device according to a first embodiment of the present disclosure.
Figure 2:
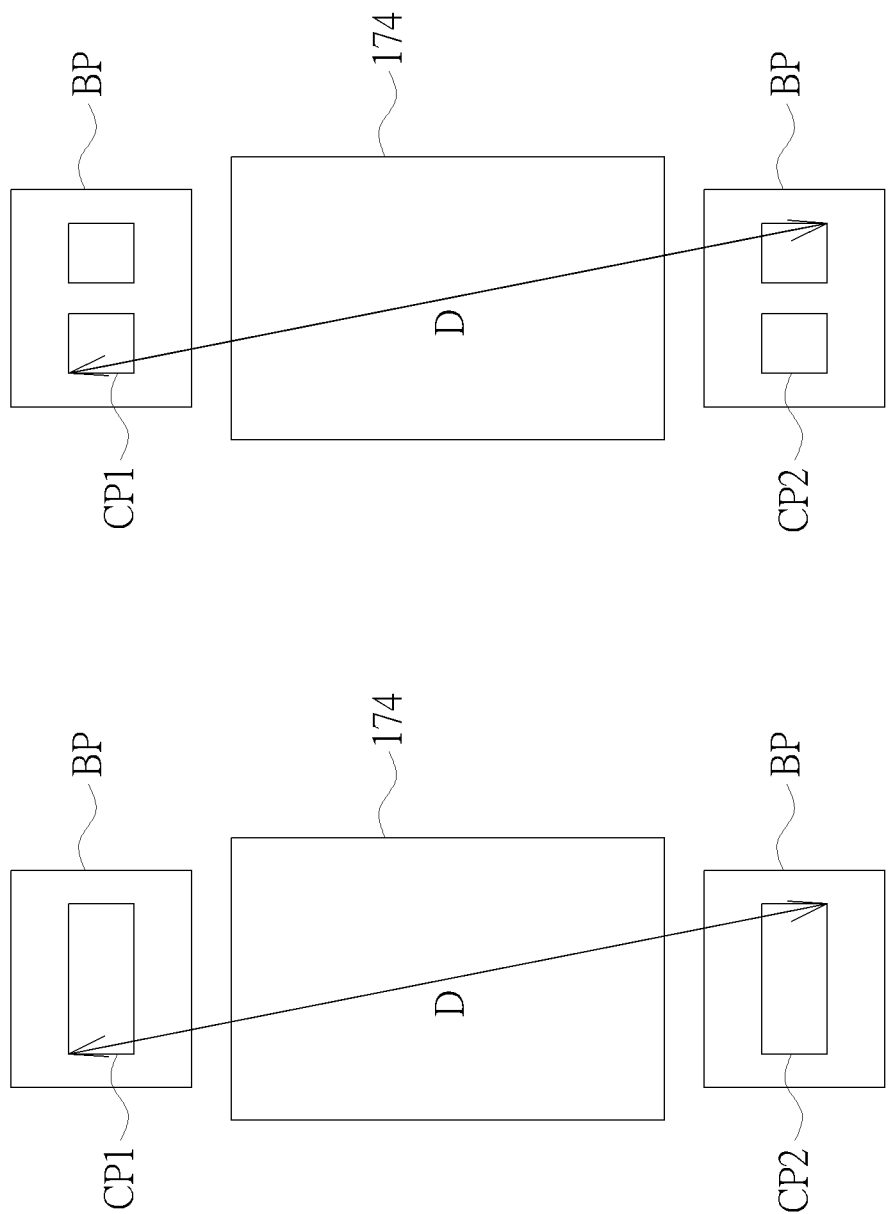
FIG. 2A and FIG. 2B are schematic diagrams showing a top-view of a light emitting device and bonding pads of the substrate structure of the electronic device according to the first embodiment of the present disclosure.
Figure 3:
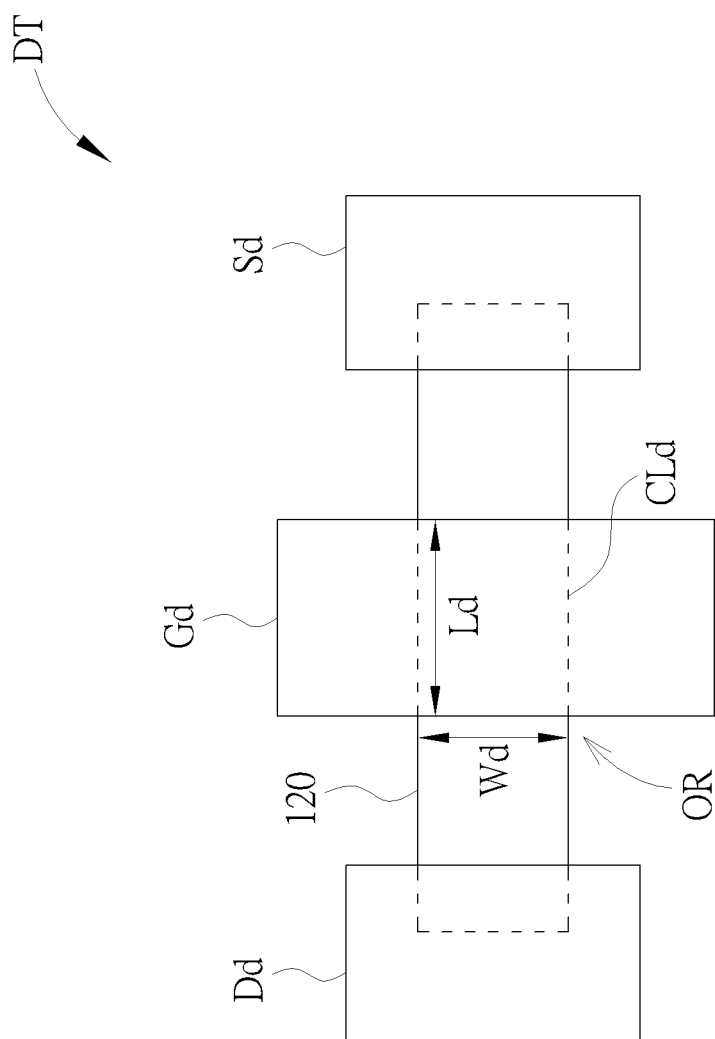
FIG. 3 is schematic diagram showing a top-view of a thin film transistor of the substrate structure of the electronic device according to the first embodiment of the present disclosure.

Referring to FIG. 1 to FIG. 3, FIG. 1 is a schematic diagram showing a cross-sectional view of a substrate structure of an electronic device according to a first embodiment of the present disclosure, FIG. 2A and FIG. 2B are schematic diagrams showing a top-view of a light emitting device and bonding pads of the substrate structure of the electronic device according to the first embodiment of the present disclosure, and FIG. 3 is a schematic diagram showing a top-view of a thin film transistor of the substrate structure of the electronic device according to the first embodiment of the present disclosure, wherein FIG. 2A and FIG. 2B only show a light emitting layer 174, connecting posts and bonding pads BP to make the figures clear. As shown in FIG. 1 to FIG. 3, a substrate structure 100 of an electronic device ED is shown, and the substrate structure 100 includes a substrate 110, a driving circuit structure DCS and at least one light emitting device LD. The substrate 110 may be a hard substrate such as a glass substrate, a plastic substrate, a quartz substrate or a sapphire substrate, or may be a flexible substrate including polyimide (PI) or polyethylene terephthalate (PET), but not limited thereto.

The driving circuit structure DCS is disposed on the substrate 110. In this embodiment, the driving circuit structure DCS may include a semiconductor layer 120, a first insulating layer 130, a first conductive layer 132, a second insulating layer 140 and a second conductive layer 142. The semiconductor layer 120 is disposed on the surface of the substrate 110, the first insulating layer 130 is disposed on the semiconductor layer 120, the first conductive layer 132 is disposed on the first insulating layer 130, the second insulating layer 140 is disposed on the first conductive layer 132, and the second conductive layer 142 is disposed on the second insulating layer 140. Furthermore, the driving circuit structure DCS may have at least one driving thin film transistor DT, formed by the conductive layers and the insulating layers thereof. Specifically, in this embodiment, the driving thin film transistor DT includes a channel layer CLd formed of the semiconductor layer 120, a gate electrode Gd formed of the first conductive layer 132, a gate insulator GId formed of the first insulating layer 130, and a source electrode Sd and a drain electrode Dd formed of the second conductive layer 142, such that the driving thin film transistor DT is formed as a top gate transistor, but not limited thereto. In another embodiment, the driving thin film transistor DT may be other type transistor, such as bottom gate transistor. Furthermore, the gate electrode Gd and the channel layer CLd of the driving thin film transistor DT may have any suitable shape in the top view, such as quadrangle and U-shape, but not limited thereto. In this embodiment, the gate electrode Gd and the channel layer CLd shown in FIG. 3 are rectangular, and an overlapping region OR formed by the gate electrode Gd and the channel layer CLd is rectangular, but not limited thereto. Apart from above, the driving circuit structure DCS of this embodiment may further include other conductive layer and/or other insulating layer. For example, the driving circuit structure DCS of this embodiment further includes a third insulating layer 150 disposed on the second conductive layer 142 and a third conductive layer 152 disposed on the third insulating layer 150. In addition, the driving circuit structure DCS may further have other components, such as a plurality of bonding pads BP formed of a top conductive layer. In this embodiment, the bonding pads BP is formed of the third conductive layer 152, and at least one of the bonding pads BP is electrically connected to the drain electrode Dd or the source electrode Sd of the driving thin film transistor DT, but not limited thereto.

The light emitting device LD of this embodiment may be disposed on the driving circuit structure DCS by such as a mass transferring process, and the light emitting device LD may be light-emitting diode (LED), micro light-emitting diode (micro LED), mini light-emitting diode (mini LED), organic light-emitting diode (OLED), quantum dots light-emitting diode (QLED) or other suitable light emitting device, but not limited thereto. In this embodiment, each light emitting device LD may be a kind of LED for instance and include a first carrier transmitting layer 172, a light emitting layer 174, a second carrier transmitting layer 176, a device insulating layer 180, a device conductive layer 190 and a passivation layer PS. The light emitting layer 174 is disposed on the second carrier transmitting layer 176, the first carrier transmitting layer 172 is disposed on the light emitting layer 174, the device insulating layer 180 is disposed on the first carrier transmitting layer 172, the device conductive layer 190 is disposed on the device insulating layer 180, and the passivation layer PS is disposed on the device conductive layer 190. In this embodiment, the device conductive layer 190 includes a first electrode EL1 and a second electrode EL2, the first electrode EL1 is electrically connected to the first carrier transmitting layer 172 through a conductive connecting structure CS, and the second electrode EL2 is electrically connected to the second carrier transmitting layer 176 through another conductive connecting structure CS separated from the first carrier transmitting layer 172 by an inner insulating structure IS, but the present disclosure is not limited thereto. Moreover, the light emitting device LD has a first connecting post CP1 and a second connecting post CP2 thereby being disposed on the driving circuit structure DCS; that is, the first connecting post CP1 and the second connecting post CP2 are respectively mounted on the bonding pads BP in the mass transferring process. In this embodiment, the first connecting post CP1 and the second connecting post CP2 are respectively embedded to the corresponding bonding pads BP and respectively electrically connected to the first electrode EL1 and the second electrode EL2. Thus, the light emitting device LD is electrically connected to the driving thin film transistor DT through the first connecting post CP1 and the bonding pad BP. A type of the light emitting device LD shown in FIG. 2A has one first connecting post CP1 and one second connecting post CP2, and another type of the light emitting device LD shown in FIG. 2B has a plurality of first connecting posts CP1 and a plurality of second connecting posts CP2 to be mounted on the bonding pads BP stably, but the present disclosure is not limited thereto. In addition, the first connecting post CP1 and the second connecting post CP2 of this embodiment may be formed of the device conductive layer 190, but not limited thereto. In other words, parts of the device conductive layer 190 protrudes from an extension surface of a bottom surface of the second carrier transmitting layer 176 is the first connecting post CP1 and the second connecting post CP2, the other parts of the device conductive layer 190 is the first electrode EL1 and the second electrode EL2. In another embodiment, the first connecting post CP1 and the second connecting post CP2 may be formed of other conductive structure. Furthermore, the light emitting device LD of this embodiment emits light downward (from up to down) in FIG. 1, but not limited thereto. Apart from above, in this embodiment, an adhesive layer 160 may be further disposed on the driving circuit structure DCS and in contact with the light emitting device LD to enhance the connection between the light emitting device LD and the driving circuit structure DCS, and the adhesive layer 160 of this embodiment is situated between the light emitting device LD and the driving circuit structure DCS. Also, after disposing the light emitting device LD, an over coating layer OC may be further formed to cover the light emitting device LD to protect the light emitting device LD.

Note that, the driving thin film transistor DT is configured to drive the light emitting device LD and control a driving current for emitting light, and the driving thin film transistor DT may be electrically connected between the light emitting device LD and a voltage source and may be electrically connected to a data input (i.e. providing a gray level signal). For example, in this embodiment, one of the drain electrode Dd and the source electrode Sd of the driving thin film transistor DT is electrically connected to a voltage source (i.e. providing higher voltage), the other one of the drain electrode Dd and the source electrode Sd of the driving thin film transistor DT is electrically connected to the light emitting device LD, the gate electrode Gd of the driving thin film transistor DT is electrically connected to a gate input, and the second connecting post CP2 of the light emitting device LD may be electrically connected to a common electrode or another voltage source providing a common voltage or other suitable voltage (i.e. lower voltage), but not limited thereto. Any suitable circuit may be used in the present disclosure, and the driving thin film transistor DT may be further electrically connected to other component or compensating circuit.

In order to enhance alight emitting area of the light emitting device LD (for example, an opening rate of a pixel of a display device), a size of the light emitting device LD may be increased. When the size of the light emitting device LD is increased, a driving current configured to drive the light emitting device LD needs to be increased, and a distance D between the first connecting post CP1 and the second connecting post CP2 is greater. A formula of the current passing through a transistor in a saturation mode is shown below:

$$I_D=[(\mu_n \times C_{ox})/2] \times [W/L] \times (V_{GS}-V_{TH})^2,$$

wherein $I_D$ is a current flow, $\mu_n$ is a carrier mobility, $C_{ox}$ is a gate oxide capacitance per unit area, W is a channel width, L is a channel length, $V_{GS}$ is a voltage difference between gate and source, and $V_{TH}$ is a threshold voltage. According to the current formula, when the channel length of the channel layer CLd of the driving thin film transistor DT is reduced, the driving current passing through the driving thin film transistor DT is increased. In this embodiment, the distance D between the first connecting post CP1 and the second connecting post CP2 of the light emitting device LD is greater than a channel length Ld of the channel layer CLd of the driving thin film transistor DT. In other words, the ratio (D/Ld) of the distance D between the first connecting post CP1 and the second connecting post CP2 to the length Ld is greater than 1. Note that, the channel length Ld of the driving thin film transistor DT is a shortest dimension (or shortest distance) of the overlapping region OR in a direction from the source electrode Sd to the drain electrode Dd of the driving thin film transistor DT (shown in FIG. 1 and FIG. 3), the channel width Wd of the driving thin film transistor DT is a shortest dimension of the overlapping region OR in a direction perpendicular to the channel length Ld (shown in FIG. 3), and the distance D between the first connecting post CP1 and the second connecting post CP2 is a greatest dimension between the first connecting post CP1 and the second connecting post CP2 in top view. For example, the distance D between the first connecting post CP1 and the second connecting post CP2 shown in FIG. 2A is a distance between a left-up corner of the first connecting post CP1 and a right down corner of the second connecting post CP2, and the distance D between the first connecting post CP1 and the second connecting post CP2 shown in FIG. 2B is a distance between a left-up corner of the left first connecting post CP1 and a right down corner of the right second connecting post CP2. The ratio D/Ld being greater than 1 may bring the advantage of increasing the driving current, and this design may be applied to other embodiments and their variant embodiments in the hereinafter.

It should be noted that if the channel layer CLd of the driving thin film transistor DT is irradiated by the light emitted by the light emitting layer 174, it may occur an electrical leakage phenomenon. In addition, the light emitting area may be reduced if the channel layer CLd overlaps the light emitting layer 174. As a result, the light emitting layer 174 may not overlap with the channel layer CLd in the top view according to this embodiment. Furthermore, in order to prevent the driving thin film transistor DT from be damaged during the processes of transferring the light emitting device LD and mounting the first connecting post CP1 and the second connecting post CP2 on the bonding pads BP (for instance, the gate electrode Gd and the channel layer CLd of the driving thin film transistor DT may be in contact with each other in the transferring or mounting process), the channel layer CLd may not overlap with the first connecting post CP1, or may not overlap with the first connecting post CP1 and the second connecting post CP2 in the top view. In other words, the projection of the channel layer CLd on the surface of the substrate 110 and the projection of the light emitting layer 174 on the surface of the substrate 110 are not overlapped. In another embodiment, the projections of the channel layer CLd, the light emitting layer 174, the first connecting post CP1 and the second connecting post CP2 on the surface of the substrate 110 are separate from each other (as shown in FIG. 1). Therefore, the reliability of the driving thin film transistor DT may be enhanced.

In the above, the conductive layers may individually include metal material or transparent conductive material (such as indium tin oxide (ITO), indium zinc oxide (IZO)), and each insulating layer may individually include silicon oxide, silicon nitride and/or silicon oxynitride, and channel layer CLd may include low temperature poly-silicon (LTPS), indium gallium zinc oxide (IGZO) or amorphous silicon (a-Si), but the present disclosure is not limited thereto.

Figure 4:
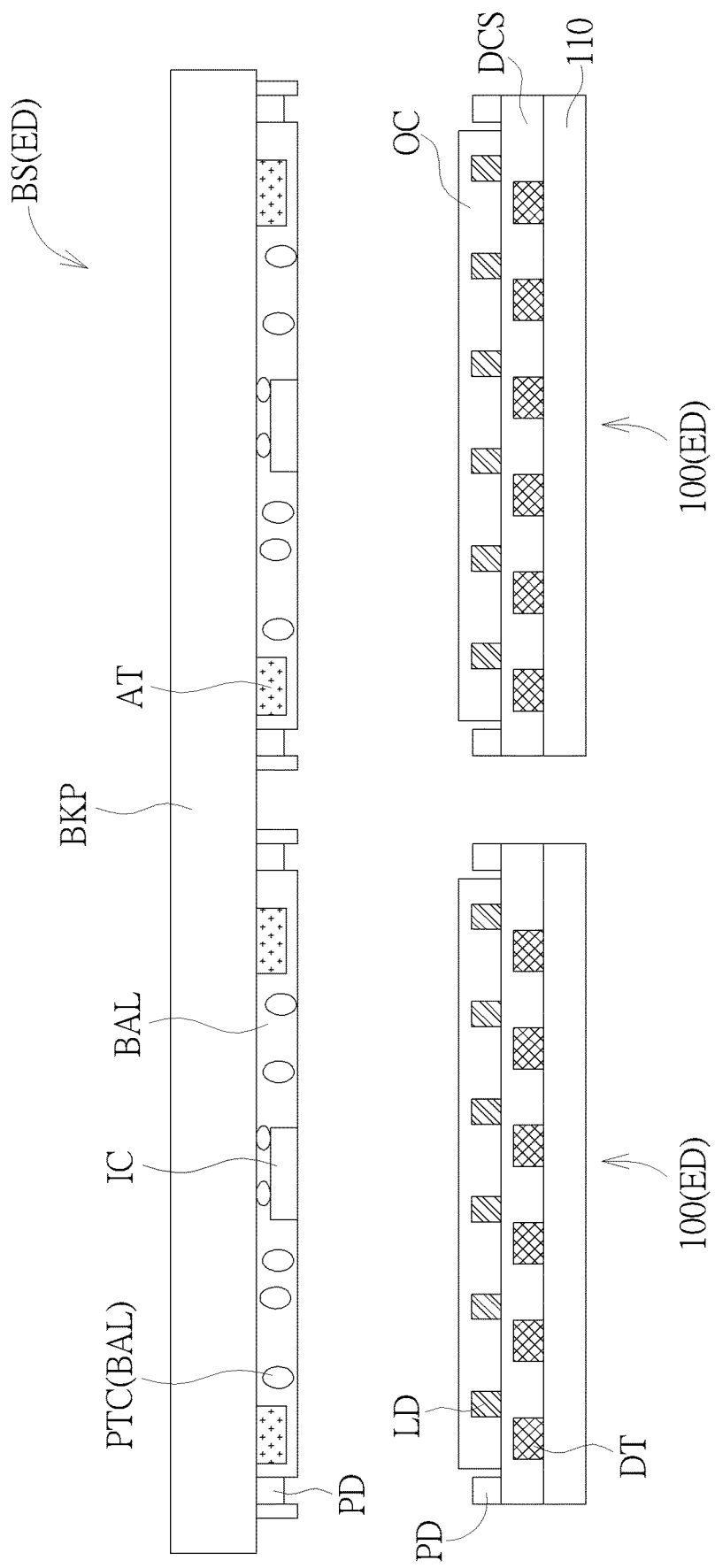
FIG. 4 is schematic diagram showing a cross-sectional view of the substrate structure and a backplane structure of the electronic device before assembling according to an embodiment of the present disclosure.
Figure 5:
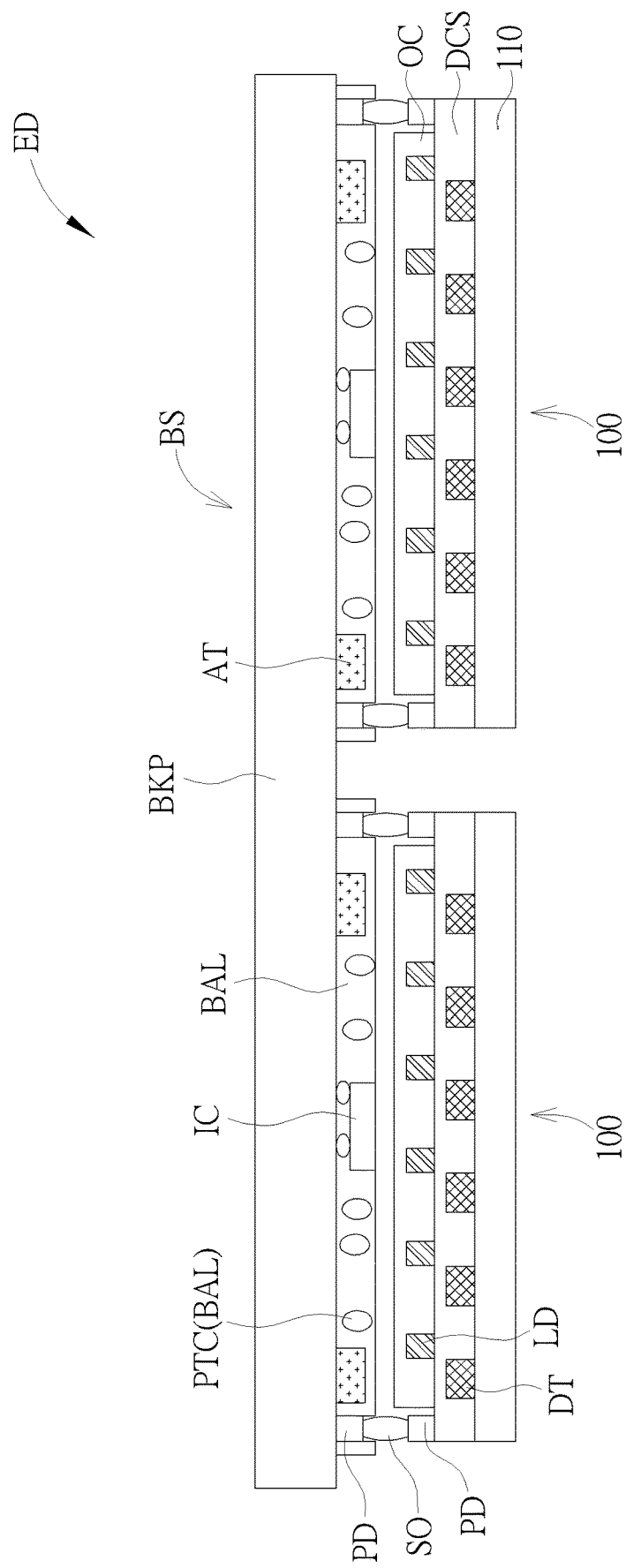
FIG. 5 is schematic diagram showing a cross-sectional view of the electronic device according to an embodiment of the present disclosure.

Referring to FIG. 4 and FIG. 5, FIG. 4 is schematic diagram showing a cross-sectional view of the substrate structure and a backplane structure of the electronic device before assembling according to an embodiment of the present disclosure, and FIG. 5 is schematic diagram showing a cross-sectional view of the electronic device according to an embodiment of the present disclosure, wherein the driving thin film transistor DT and the light emitting device LD shown in FIG. 4 and FIG. 5 may be the same as the first embodiment or other suitable embodiments disclosed in the present disclosure. As shown in FIG. 4, the electronic device ED of this embodiment may include at least one substrate structure 100 and a backplane structure BS, wherein FIG. 4 shows two substrate structures 100 and one backplane structure BS before assembling. Regarding to the backplane structure BS, the backplane structure BS includes a backplane BKP, at least one integrated circuit IC and a backplane adhesive layer BAL, and the integrated circuit IC and the backplane adhesive layer BAL is disposed on a surface of the backplane BKP, wherein the integrated circuit IC is configured to control the gray level signal providing to the light emitting device LD, and the backplane adhesive layer BAL may be disposed overall. In this embodiment, the backplane adhesive layer BAL may be an anisotropic conductive film (ACF) including conductive particles PTC, and the integrated circuit IC may be electrically connected to other components on the backplane BKP through conductive particles PTC of the backplane adhesive layer BAL, but the present disclosure is not limited thereto. As shown in FIG. 5, the substrate structure 100 and the backplane structure BS are assembled by disposing solders SO between connecting pads PD on the substrate structure 100 and connecting pads PD on the backplane structure BS. Thus, after assembling, the integrated circuit IC and the light emitting device LD are situated between the backplane BKP and the substrate 110, and the integrated circuit IC is electrically connected to the driving thin film transistor DT through the connecting pads PD on the substrate structure 100, the connecting pads PD on the backplane structure BS and the solders SO, but not limited thereto. In this embodiment, the backplane adhesive layer BAL may not be in contact with the substrate structure 100, but not limited thereto. In another embodiment, the backplane adhesive layer BAL may be directly in contact with the substrate structure 100 for enhancing adhesion between the substrate structure 100 and the backplane structure BS. In addition, the electronic device ED may further include an assisting thin film transistor AT electrically connected between the integrated circuit IC and the driving thin film transistor DT. The assisting thin film transistor AT is configured to provide some functions to reduce the number of the integrated circuit IC. For instance, the assisting thin film transistor AT of this embodiment may be disposed on the backplane BKP (in the backplane structure B S) and serve as a component of a gate driver on panel (GOP), but not limited thereto.

In this embodiment, because the light emitting device LD emits the light downward in FIG. 1, FIG. 4 and FIG. 5, an issue which the assisting thin film transistor AT and the integrated circuit IC shield the light emitting device LD needs not to be considered, and the backplane BKP and the backplane adhesive layer BAL may be transparent, opaque or translucent. In other words, the selection of the material and types of the backplane BKP and the backplane adhesive layer BAL may be for flexible. Furthermore, the electronic device ED of this embodiment may include a plurality of substrate structures 100 connected to each other, but not limited thereto. In another embodiment, the electronic device ED includes one substrate structure 100 connected to one backplane structure BS.

According to some embodiments, the electronic device ED may be a display device, such as a LED display, a micro LED display, a mini LED display, an OLED display, a QLED display, a flexible display and other suitable display devices, wherein the light emitting devices LD and the driving thin film transistors DT may be arranged as an array or other suitable type. Furthermore, the substrate structure 100 in the display device may be configured to display images directly (i.e., the light emitting devices LD of the substrate structure 100 emits the light based on gray level signals) or be configured to be a component of a backlight module (i.e., the light emitting devices LD of the substrate structure 100 emits light for providing backlight) for example. Also, the display device may further include a related portion of other elements or layers, such as a related portion of substrate 110, a related portion of polarizer, a related portion of insulating layer, or a related portion of encapsulation layer. According to some embodiments, the electronic device ED may be an electronic device that has no display function or may be other suitable electronic device, for example, an antenna.

The electronic device of the present disclosure is not limited to the above embodiments. Further embodiments of the present disclosure are described below. For ease of comparison, same components will be labeled with the same symbol in the following. The following descriptions relate the differences between each of the embodiments, and repeated parts will not be redundantly described.

Figure 6:
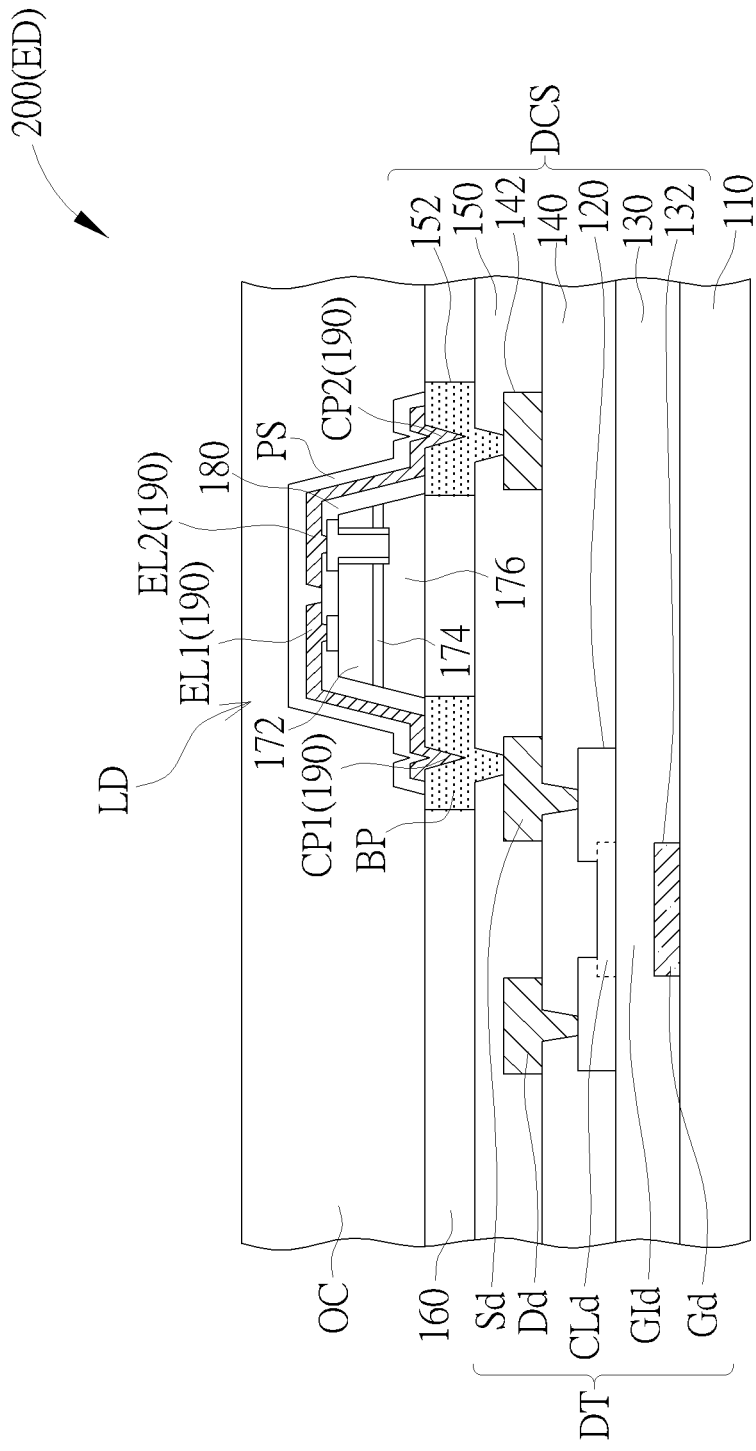
FIG. 6 is a schematic diagram showing a cross-sectional view of a substrate structure of an electronic device according to a second embodiment of the present disclosure.

Referring to FIG. 6, FIG. 6 is a schematic diagram showing a cross-sectional view of a substrate structure of an electronic device according to a second embodiment of the present disclosure. As shown in FIG. 6, a difference between this embodiment and the first embodiment is that the driving thin film transistor DT of the substrate structure 200 of this embodiment is a bottom gate transistor. That is to say, the gate electrode Gd, the gate insulator GId, the channel layer CLd, the source electrode Sd and the drain electrode Dd are formed as a bottom gate transistor.

Figure 7:
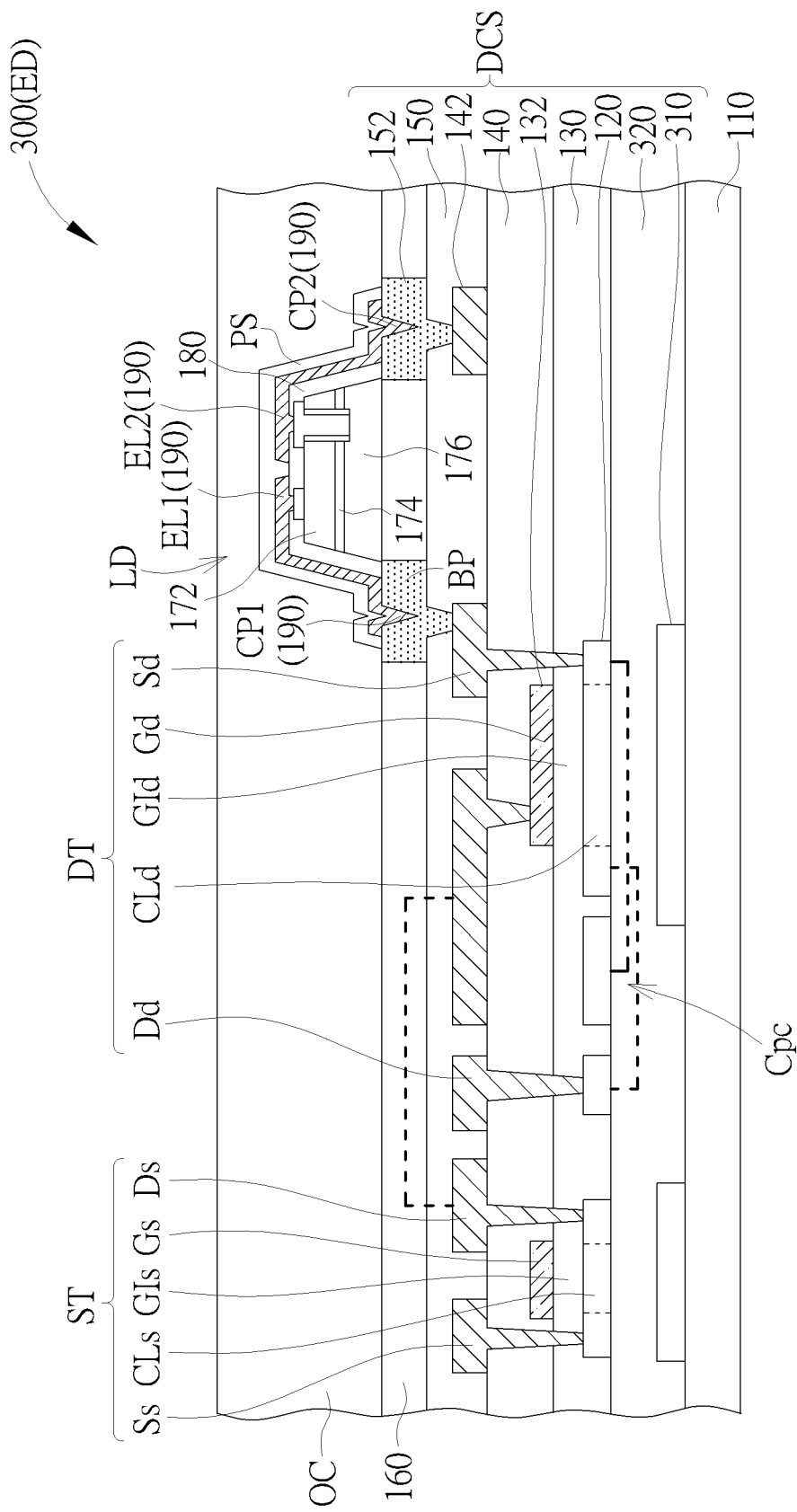
FIG. 7 is a schematic diagram showing a cross-sectional view of a substrate structure of an electronic device according to a third embodiment of the present disclosure.
Figure 8:
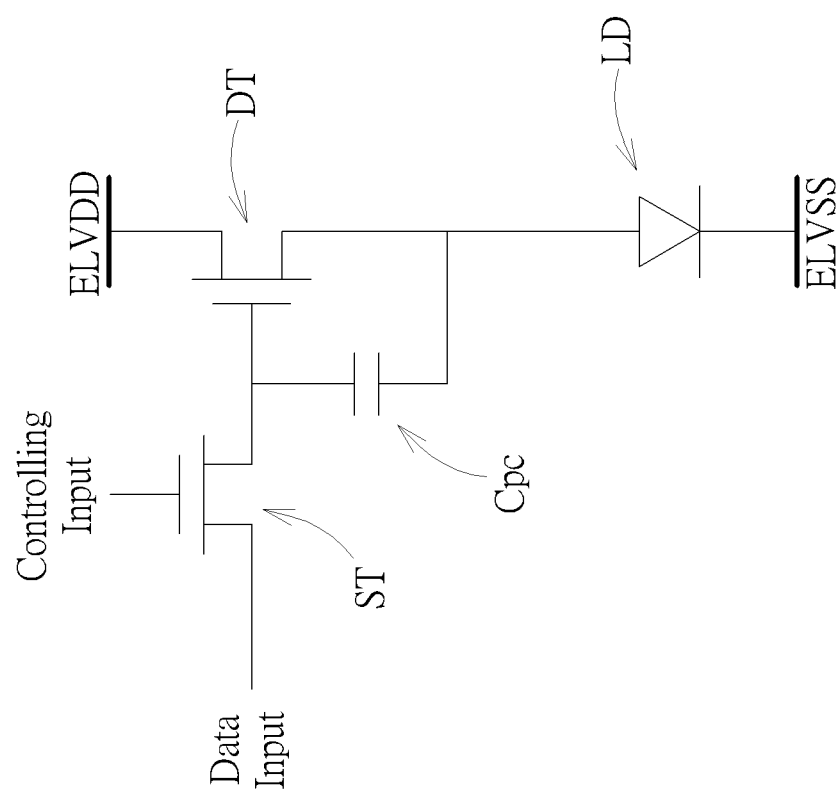
FIG. 8 is a schematic diagram showing an equivalent circuit of the substrate structure of the electronic device according to the third embodiment of the present disclosure.

Referring to FIG. 7 and FIG. 8, FIG. 7 is a schematic diagram showing a cross-sectional view of a substrate structure of an electronic device according to a third embodiment of the present disclosure, and FIG. 8 is a schematic diagram showing an equivalent circuit of the substrate structure of the electronic device according to the third embodiment of the present disclosure, wherein dash-lines in FIG. 7 represent electrical connection paths. As shown in FIG. 7 and FIG. 8, a difference between this embodiment and the first embodiment is that the driving circuit structure DCS of the substrate structure 300 further includes at least one switching thin film transistor ST and a capacitor Cpc, and the switching thin film transistor ST and the capacitor Cpc are electrically connected to the driving thin film transistor DT. In this embodiment, for example, the structure of the switching thin film transistor ST may be similar to the driving thin film transistor DT; that is, a channel layer CLs of the switching thin film transistor ST is formed of the semiconductor layer 120, a gate electrode Gs of the switching thin film transistor ST is formed of the first conductive layer 132, a gate insulator GIs of the switching thin film transistor ST is formed of the first insulating layer 130, and a source electrode Ss and a drain electrode Ds of the switching thin film transistor ST is formed of the second conductive layer 142, but not limited thereto. The capacitor Cpc of this embodiment is formed by the semiconductor layer 120 and the second conductive layer 142, but not limited thereto. Moreover, the driving circuit structure DCS may optionally include a fourth conductive layer 310 and a buffer 320, wherein the fourth conductive layer 310 is disposed between the buffer 320 and the substrate 110, and the buffer 320 is disposed between the fourth conductive layer 310 and the first conductive layer 132. Regarding to the circuit of this embodiment, the gate electrode Gs of the switching thin film transistor ST is electrically connected to a controlling input providing a switching signal, one of the source electrode Ss and the drain electrode Ds of the switching thin film transistor ST is electrically connected to a data input, the other one of the source electrode Ss and the drain electrode Ds of the switching thin film transistor ST is electrically connected to the gate electrode Gd of the driving thin film transistor DT and the capacitor Cpc, one of the source electrode Sd and the drain electrode Dd of the driving thin film transistor DT is electrically connected to one voltage source (ELVDD shown in FIG. 8), the other one of the source electrode Sd and the drain electrode Dd of the driving thin film transistor DT is electrically connected to the capacitor Cpc and the first connecting post CP1 of the light emitting device LD, and the second connecting post CP2 of the light emitting device LD is electrically connected to another voltage source (ELVSS shown in FIG. 8), such that the switching thin film transistor ST may control the light emitting device LD to change intensity of the light, and the capacitor Cpc may maintain the intensity of the light emitted by the light emitting device LD in a while, but not limited thereto. Any suitable component may be added in this circuit. Also, any suitable circuit having the similar function may be used in the present disclosure.

Figure 9:
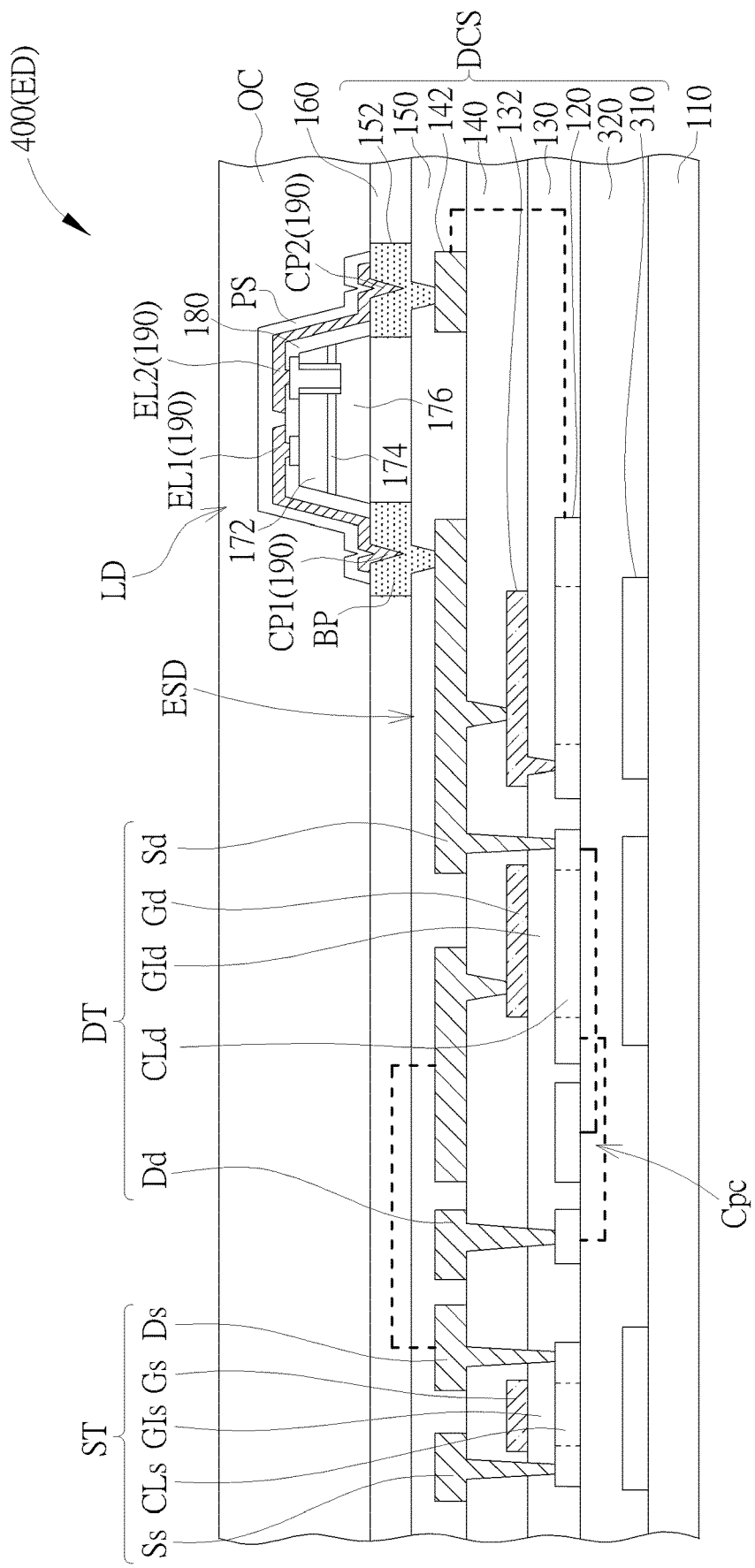
FIG. 9 is a schematic diagram showing a cross-sectional view of a substrate structure of an electronic device according to a fourth embodiment of the present disclosure.
Figure 10:
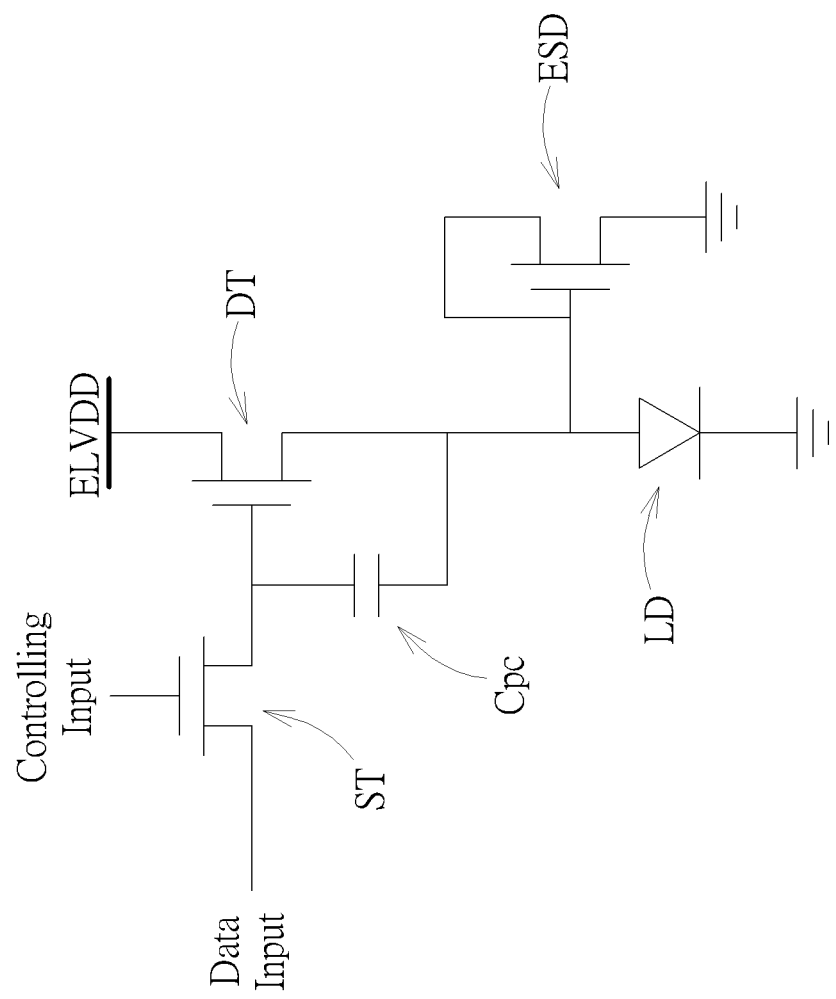
FIG. 10 is a schematic diagram showing an equivalent circuit of the substrate structure of the electronic device according to the fourth embodiment of the present disclosure.

Referring to FIG. 9 and FIG. 10, FIG. 9 is a schematic diagram showing a cross-sectional view of a substrate structure of an electronic device according to a fourth embodiment of the present disclosure, and FIG. 10 is a schematic diagram showing an equivalent circuit of the substrate structure of the electronic device according to the fourth embodiment of the present disclosure, wherein dash-lines in FIG. 9 represent electrical connection paths. As shown in FIG. 9 and FIG. 10, a difference between this embodiment and the third embodiment is that the substrate structure 400 further includes an electrostatic discharge protection device ESD electrically connected to at least one of the first connecting post CP1 or the second connecting post CP2 of the light emitting device LD. The electrostatic discharge protection device ESD and the driving thin film transistor DT may be manufactured simultaneously, but not limited thereto. In this embodiment, for instance, the electrostatic discharge protection device ESD may include a thin film transistor of which gate is electrically connected to its drain, so as to serve as a diode, but not limited thereto. In another embodiment, the electrostatic discharge protection device ESD may include any suitable components. Furthermore, in this embodiment, one end of the electrostatic discharge protection device ESD (the gate or the drain) is electrically connected to the first connecting post CP1 of the light emitting device LD, and the other end of the electrostatic discharge protection device ESD (the source) and the second connecting post CP2 of the light emitting device LD are electrically connected to each other and electrically connected to the common electrode, but not limited thereto. In another embodiment, one end of the electrostatic discharge protection device ESD (the gate or the drain) is electrically connected to the first connecting post CP1 of the light emitting device LD, and the other end of the electrostatic discharge protection device ESD (the source) is not electrically connected to the second connecting post CP2 of the light emitting device LD directly. Thus, the electrostatic discharge protection device ESD can release statics in the light emitting device LD.

Figure 11:
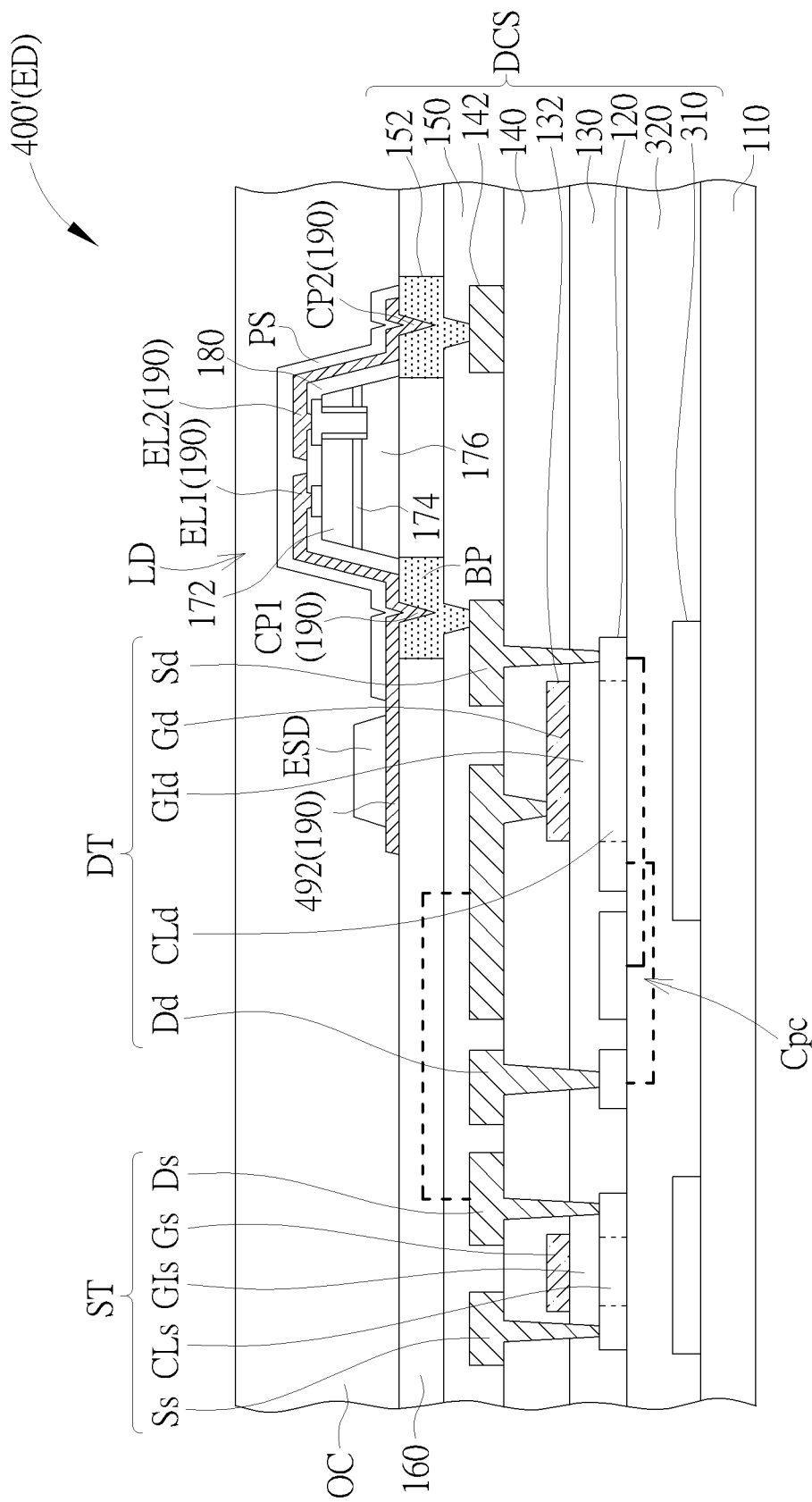
FIG. 11 is a schematic diagram showing a cross-sectional view of a substrate structure of an electronic device according to a variant embodiment of the fourth embodiment of the present disclosure.
Figure 12:
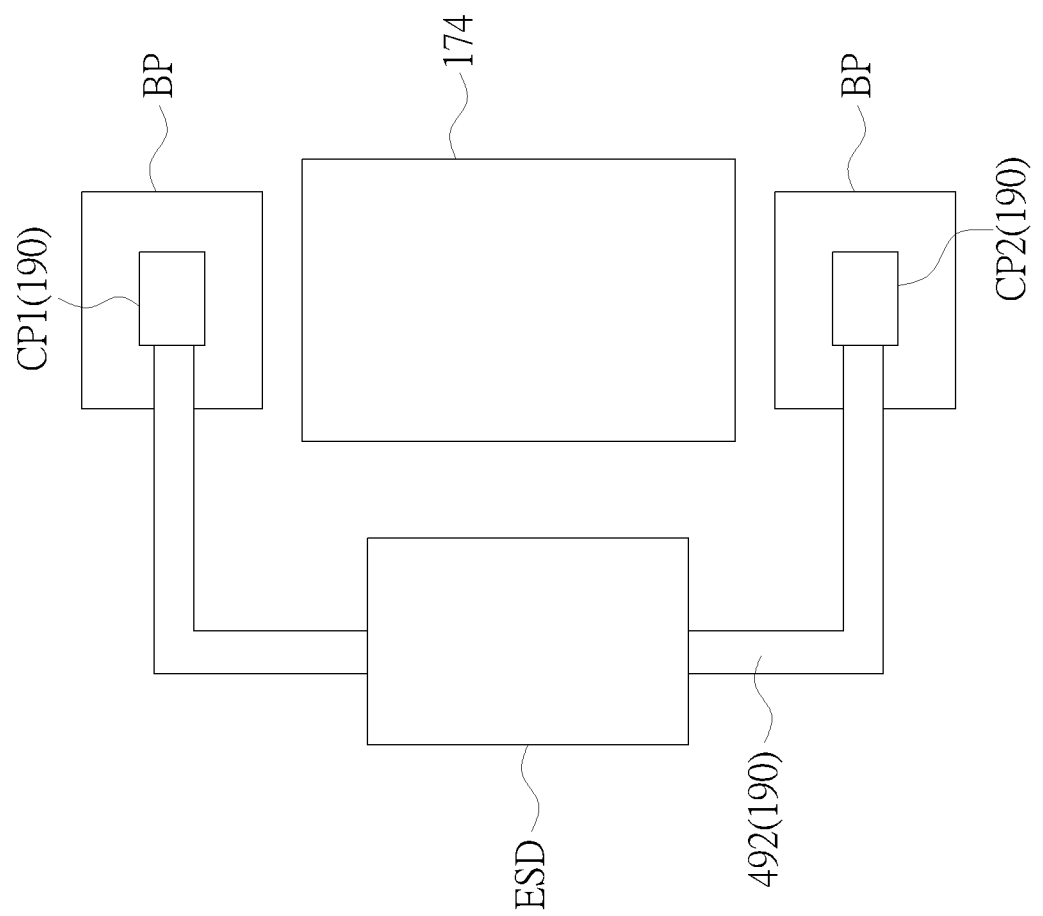
FIG. 12 is a schematic diagram showing a top-view of a light emitting device and bonding pads of the substrate structure and an electrostatic discharge protection device of the electronic device according to the variant embodiment of the fourth embodiment of the present disclosure.

Referring to FIG. 11 and FIG. 12, FIG. 11 is a schematic diagram showing a cross-sectional view of a substrate structure of an electronic device according to a variant embodiment of the fourth embodiment of the present disclosure, and FIG. 12 is a schematic diagram showing a top-view of a light emitting device and bonding pads of the substrate structure and an electrostatic discharge protection device of the electronic device according to the variant embodiment of the fourth embodiment of the present disclosure, wherein dash-lines in FIG. 11 represent electrical connection paths, and FIG. 12 only shows the light emitting layer 174, the connecting posts, the bonding pads BP, the electrostatic discharge protection device ESD and conductive lines (a portion of the device conductive layer 190) to make the figures clear. As shown in FIG. 11 and FIG. 12, a difference between this embodiment and the fourth embodiment is that the electrostatic discharge protection device ESD of the substrate structure 400' is disposed on the driving circuit structure DCS. In this embodiment, the electrostatic discharge protection device ESD and light emitting device LD may be transferred on the driving circuit structure DCS at the same time, and the electrostatic discharge protection device ESD may be electrically connected between the first connecting post CP1 and the second connecting post CP2 of the light emitting device LD through conductive lines 492 of the device conductive layer 190, but the present disclosure is not limited thereto.

Figure 13:
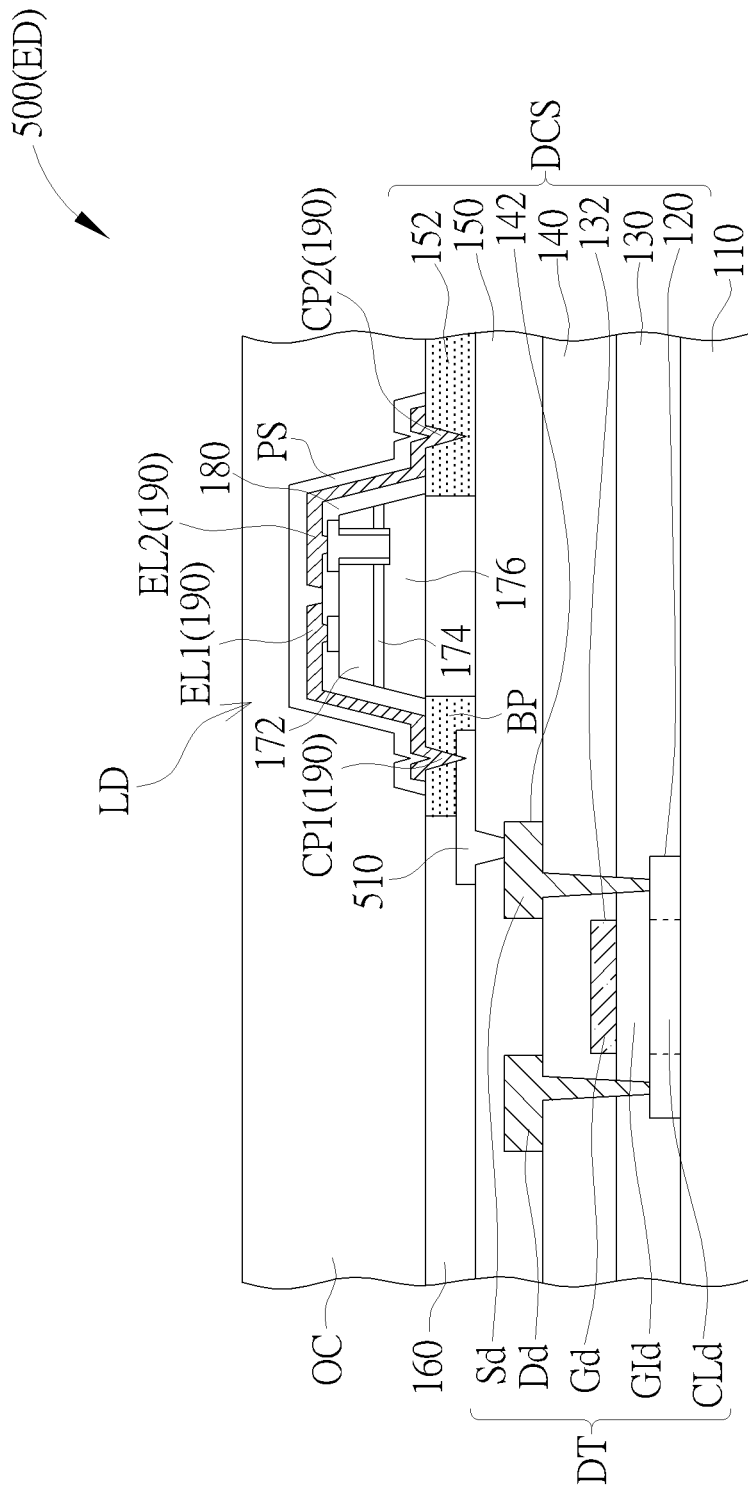
FIG. 13 is a schematic diagram showing a cross-sectional view of a substrate structure of an electronic device according to a fifth embodiment of the present disclosure.

Referring to FIG. 13, FIG. 13 is a schematic diagram showing a cross-sectional view of a substrate structure of an electronic device according to a fifth embodiment of the present disclosure. As shown in FIG. 13, a difference between this embodiment and the first embodiment is that the driving circuit structure DCS of the substrate structure 500 further includes a transparent conductive layer 510 disposed between the third insulating layer 150 and the third conductive layer 152, and the third conductive layer 152 may be electrically connected to the second conductive layer 142 through the transparent conductive layer 510. For example, one of the bonding pads BP is electrically connected to one of the drain electrode Dd and the source electrode Sd of the driving thin film transistor DT through the transparent conductive layer 510.

Figure 14:
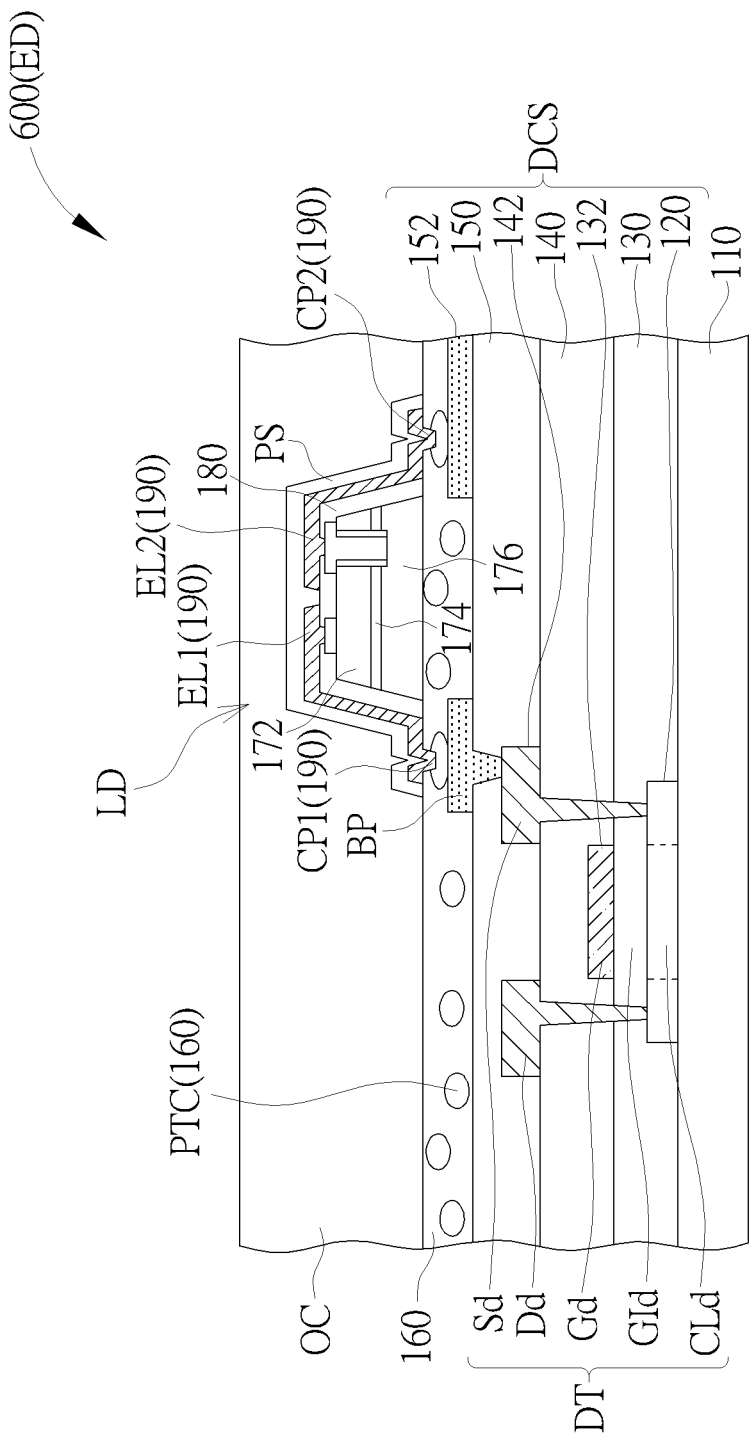
FIG. 14 is a schematic diagram showing a cross-sectional view of a substrate structure of an electronic device according to a sixth embodiment of the present disclosure.

Referring to FIG. 14, FIG. 14 is a schematic diagram showing a cross-sectional view of a substrate structure of an electronic device according to a sixth embodiment of the present disclosure. As shown in FIG. 14, a difference between this embodiment and the first embodiment is that the adhesive layer 160 is disposed between the driving circuit structure DCS and the light emitting device LD, the adhesive layer 160 is an anisotropic conductive film (ACF), and the first connecting post CP1 and the second connecting post CP2 of the light emitting device LD may be respectively electrically connected to the bonding pads BP through conductive particles PTC. In this embodiment, the conductive particles PTC are squeezed between the connecting posts (the first connecting post CP1 and the second connecting post CP2) and the bonding pads BP for forming conductive paths, but not limited thereto.

Figure 15A:
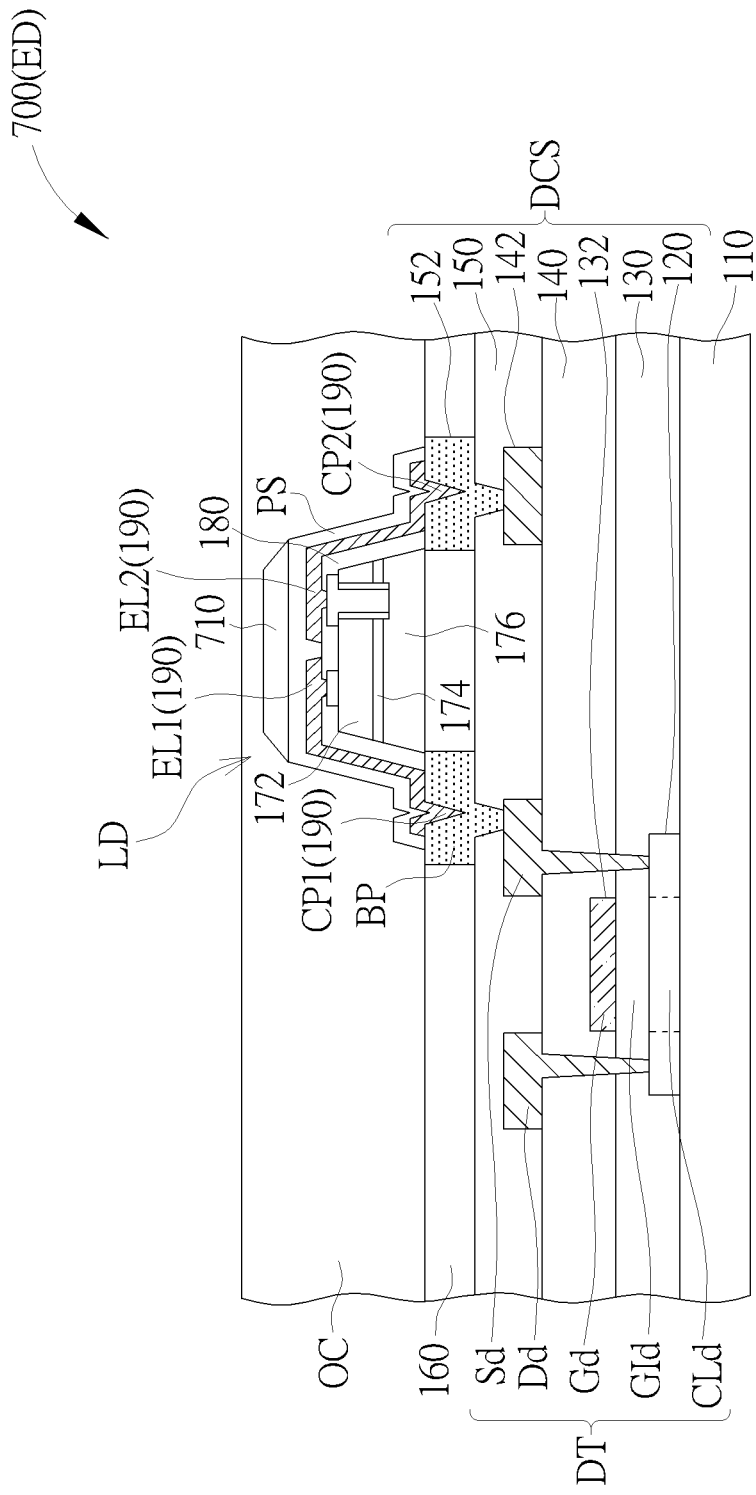
FIG. 15A and FIG. 15B are schematic diagrams showing a cross-sectional view of a substrate structure of an electronic device according to a seventh embodiment of the present disclosure.
Figure 15B:
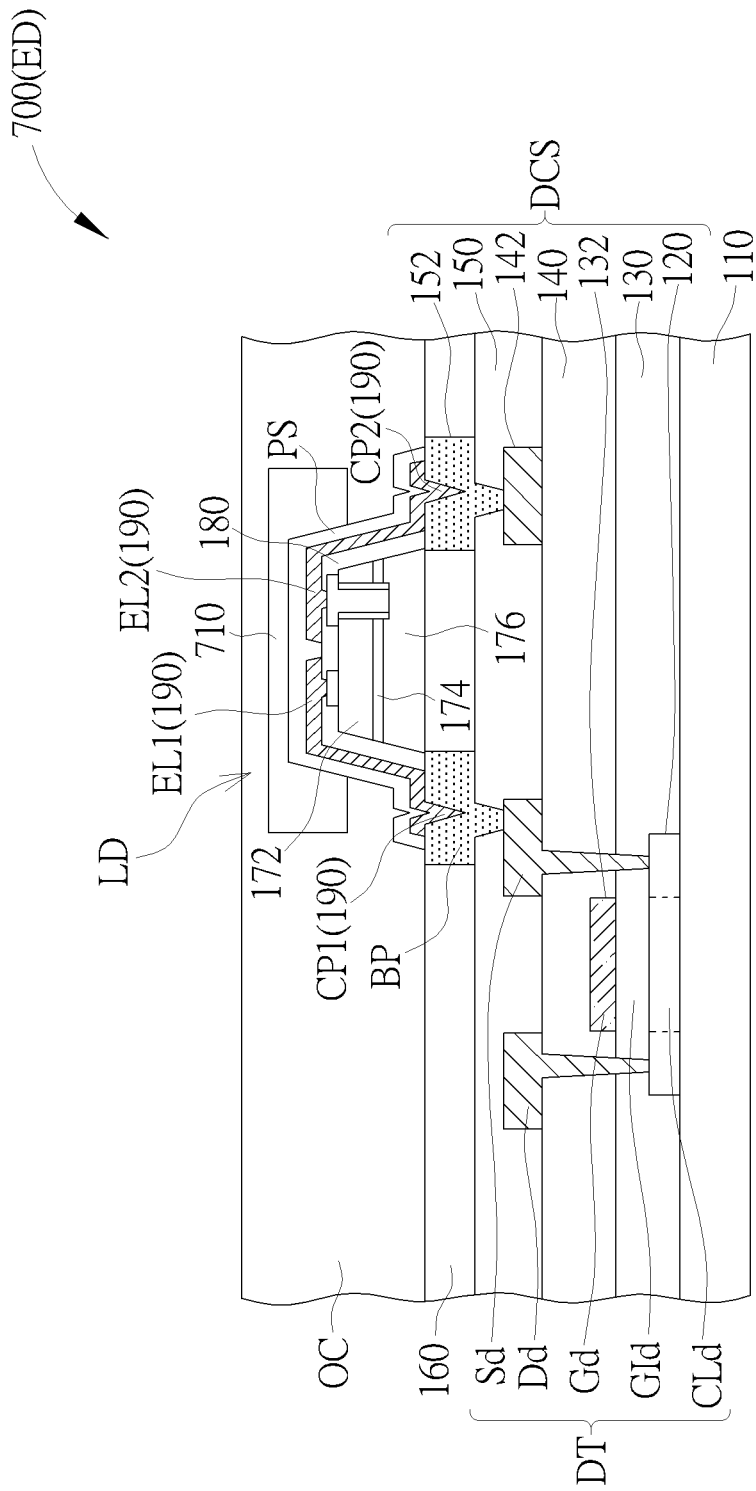

Referring to FIG. 15A and FIG. 15B, FIG. 15A and FIG. 15B are schematic diagrams showing a cross-sectional view of a substrate structure of an electronic device according to a seventh embodiment of the present disclosure. As shown in FIG. 15A and FIG. 15B, a difference between this embodiment and the first embodiment is that the electronic device ED further includes a buffer layer 710 disposed on the light emitting device LD. In this embodiment, the buffer layer 710 is disposed on the passivation layer PS and covered by the over coating layer OC. For example, the buffer layer 710 shown in FIG. 15A covers the top of the light emitting device LD, and the buffer layer 710 shown in FIG. 15B covers both the top and sidewalls of the light emitting device LD, but not limited thereto. In this embodiment, the buffer layer 710 may be configured to decrease the height difference between the light emitting devices LD to enhance adhesion between the over coating layer OC and the light emitting devices LD. Also, the buffer layer 710 may decrease the mechanical stress applying on the light emitting device LD when transferring the light emitting device LD, so as to protect the light emitting device LD. The material of the buffer layer 710 may be resin, epoxy resin, silicone, polydimethylsiloxane (PDMS), polyvinyl acetate, polyvinyl ester or polychloroprene or a combination thereof, but not limited thereto.

Figure 16:
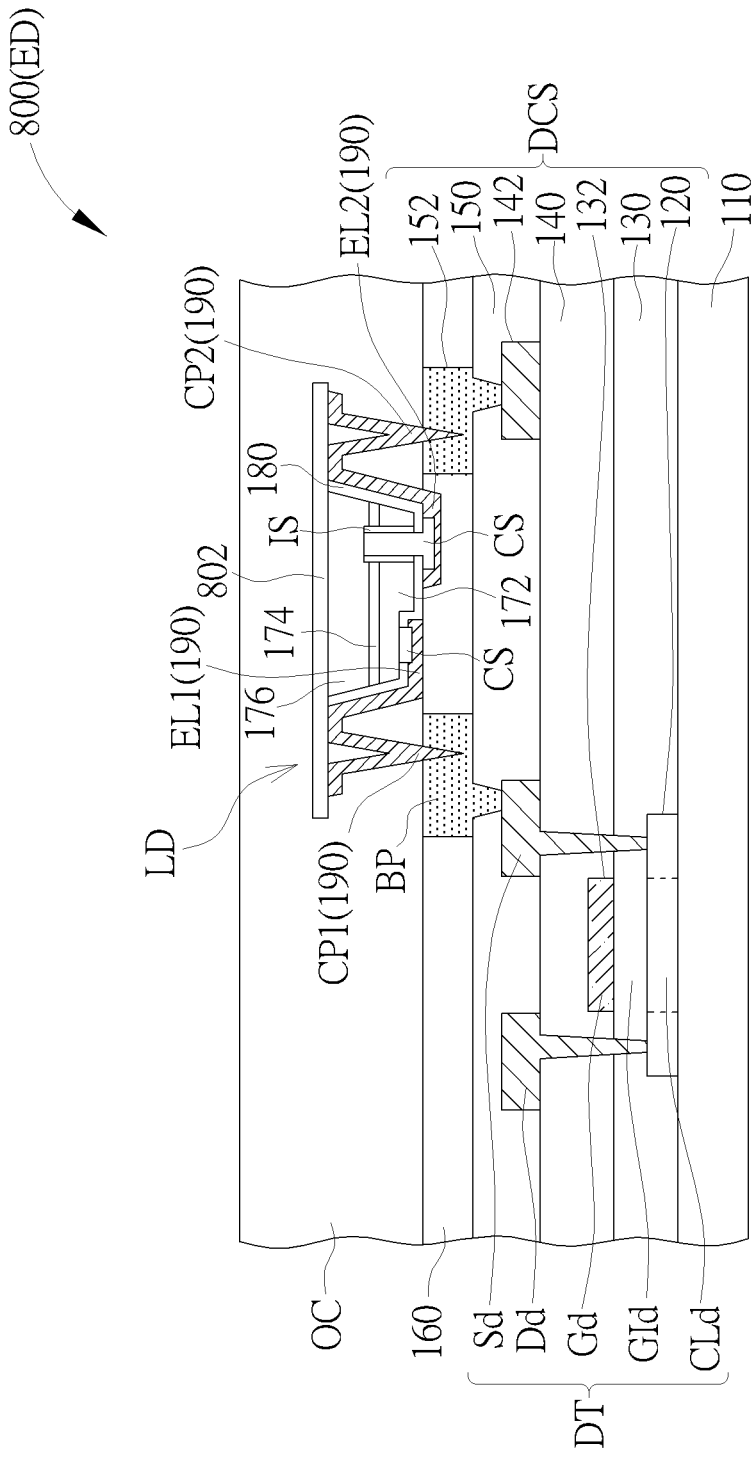
FIG. 16 is a schematic diagram showing a cross-sectional view of a substrate structure of an electronic device according to an eighth embodiment of the present disclosure.
Figure 17A:
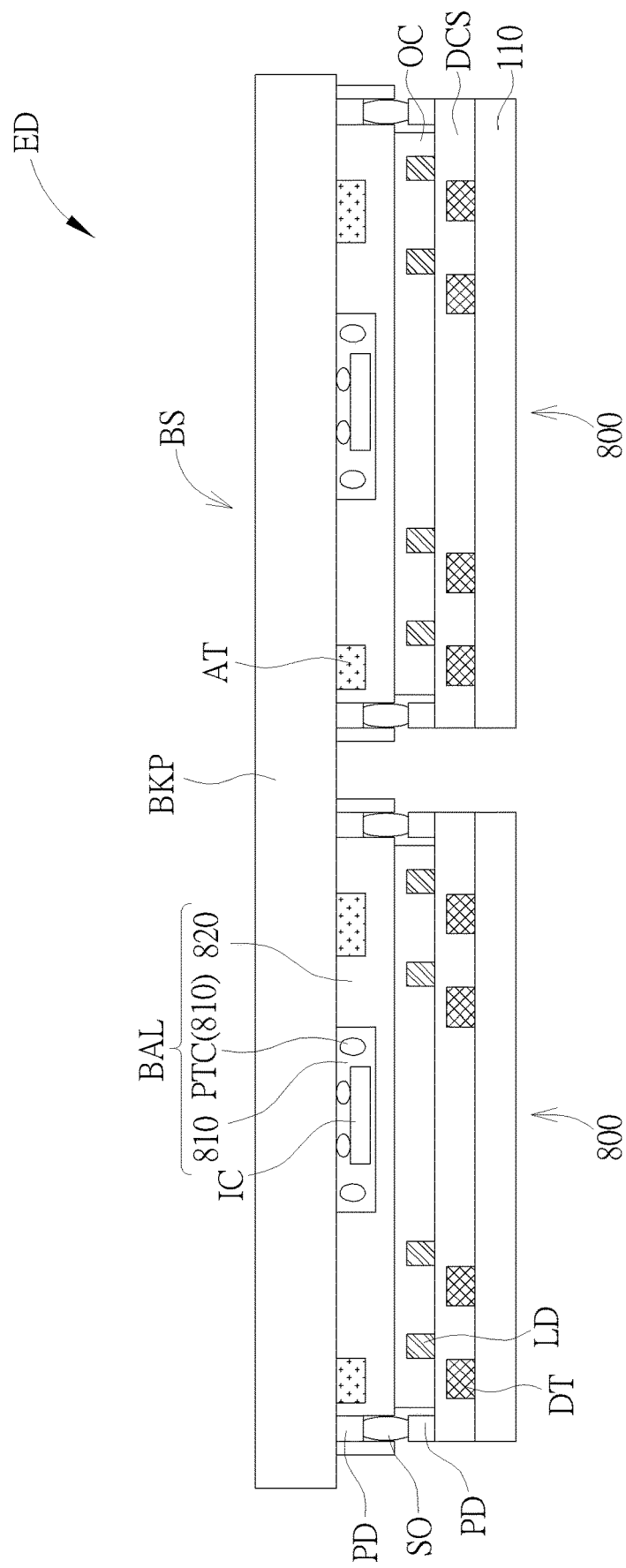
FIG. 17A and FIG. 17B are schematic diagrams showing a cross-sectional view of the electronic device according to the eighth embodiment of the present disclosure.
Figure 17B:
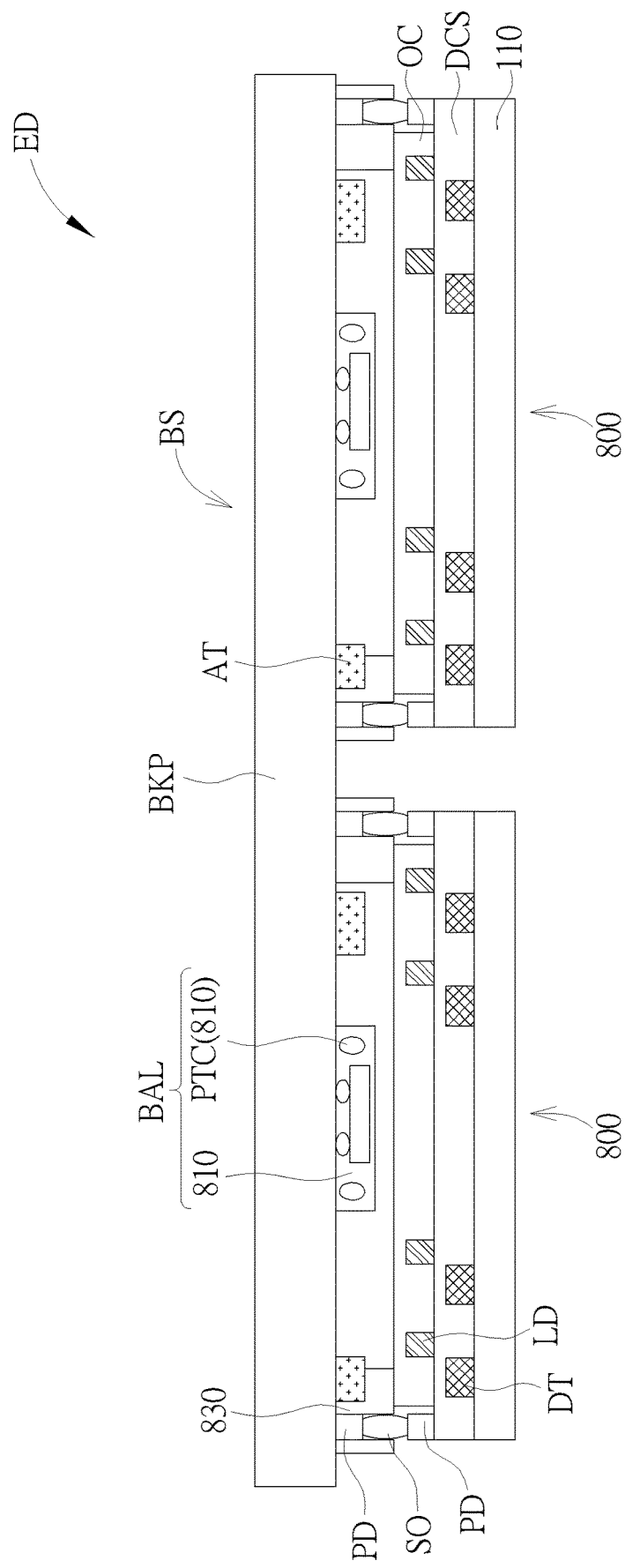

Referring to FIG. 16 to FIG. 17B, FIG. 16 is a schematic diagram showing a cross-sectional view of a substrate structure of an electronic device according to an eighth embodiment of the present disclosure, and FIG. 17A and FIG. 17B are schematic diagrams showing a cross-sectional view of the electronic device according to the eighth embodiment of the present disclosure, wherein the driving thin film transistor DT and the light emitting device LD shown in FIG. 17A and FIG. 17B may be the same as the eighth embodiment. As shown in FIG. 16, a difference between this embodiment and the first embodiment is that the light emitting device LD disposed on the driving circuit structure DCS emits light upward (from down to up) in FIG. 16. In this embodiment, the light emitting device LD is transferred reversely; that is to say, a device substrate 802 is disposed on the second carrier transmitting layer 176, wherein the device substrate 802 is a base configured to transfer light. Moreover, because the light is emitted upward, the light may not irradiate the channel layer CLd of the driving thin film transistor DT, such that the light emitting layer 174 of the light emitting device LD may overlap the channel layer CLd of the driving thin film transistor DT in some embodiments. As shown in FIG. 16 to FIG. 17B, because the light is emitted upward, the backplane BKP and the backplane adhesive layer BAL should not influence the light emitted from the light emitting device LD significantly. For example, in FIG. 17A, the backplane BKP may be transparent (i.e. the backplane BKP may include glass, polyimide or other transparent material), the overall backplane adhesive layer BAL may include an anisotropic conductive film (ACF) 810 and a transparent adhesive 820, and the transparent adhesive 820 may include acrylic, polyvinyl alcohol (PVA) or other transparent adhesive. For another example, in FIG. 17B, the backplane BKP may be transparent, the backplane adhesive layer BAL (anisotropic conductive film 810) is blanket formed, the electronic device ED further includes a frame adhesive 830 disposed on a peripheral area of the electronic device ED, and the frame adhesive 830 may include epoxy resin or other suitable adhesive. The projections of the integrated circuit IC and the assisting thin film transistor AT on the surface of the backplane BKP are separate from the projections of the light emitting devices LD on the surface of the backplane, and the light emitting devices LD are not overlapped with these components if they are made of non-transparent or opaque materials. In addition, the frame adhesive 830 shown in FIG. 17B may be transparent, opaque or translucent. Furthermore, the transparent adhesive 820 and the frame adhesive 830 respectively shown in FIG. 17A and FIG. 17B are in contact with the substrate structure 800, but not limited thereto. In another embodiment, the light emitting device LD shown in FIG. 17A and FIG. 17B may be configured to be a component of a backlight module to provide backlight, and the light emitting device LD could emit the light downward or upward. Therefore, if the light emitting device LD emits the light downward, a panel (not shown) could be disposed at a side of the substrate 110 opposite to the light emitting device LD, and the backplane BKP could be made of non-transparent or reflective material; if the light emitting device LD emits the light upward, a panel could be disposed on the backplane BKP, and the backplane BKP could be made of transparent material, but not limited thereto.

Figure 18:
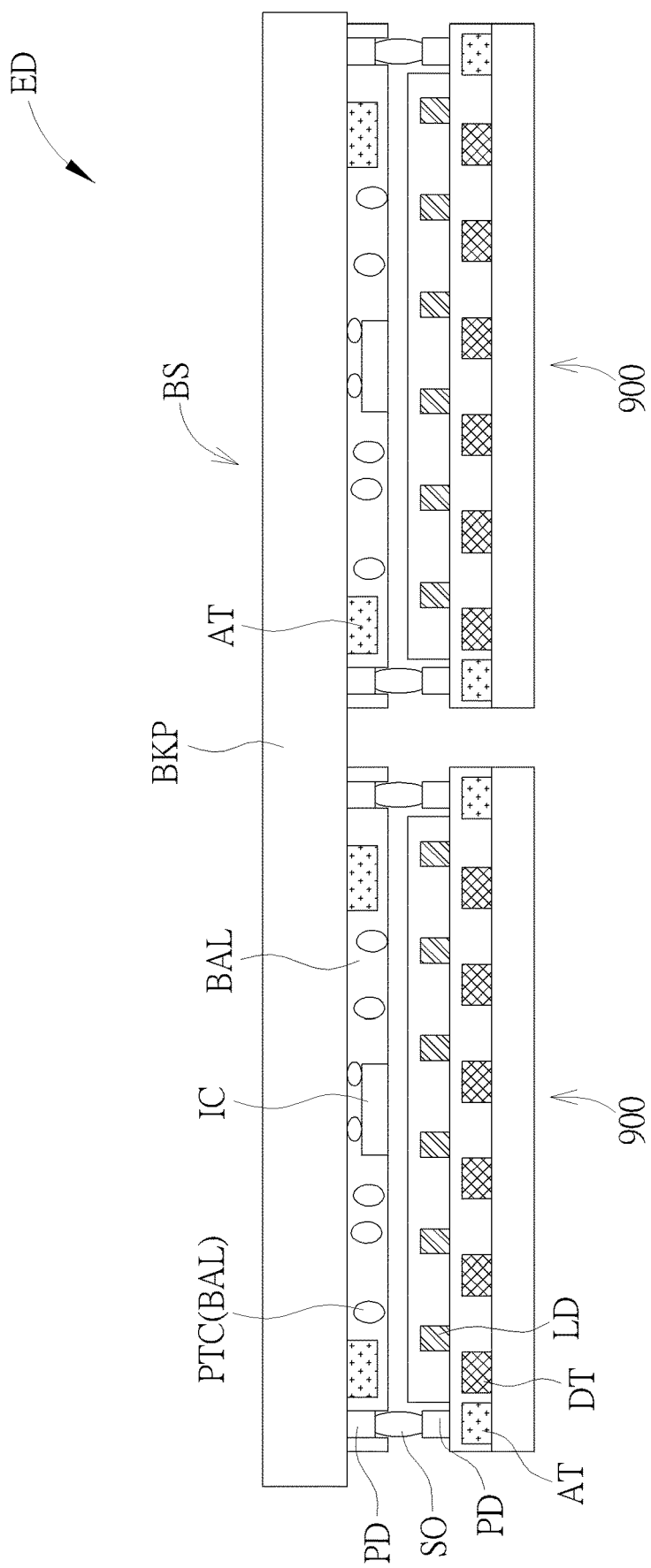
FIG. 18 is a schematic diagram showing a cross-sectional view of an electronic device according to a ninth embodiment of the present disclosure.

Referring to FIG. 18, FIG. 18 is a schematic diagram showing a cross-sectional view of an electronic device according to a ninth embodiment of the present disclosure, wherein the driving thin film transistor DT and the light emitting device LD shown in FIG. 18 may be the same as one of the above embodiments disclosed in the present disclosure or suitable variant embodiments. As shown in FIG. 18, a difference between this embodiment and the first embodiment is that the substrate structure 900 may further include one or more assisting thin film transistor (s) AT, and the assisting thin film transistor (s) AT of the substrate structure 900 may be disposed on the peripheral area of the electronic device ED.

Figure 19:
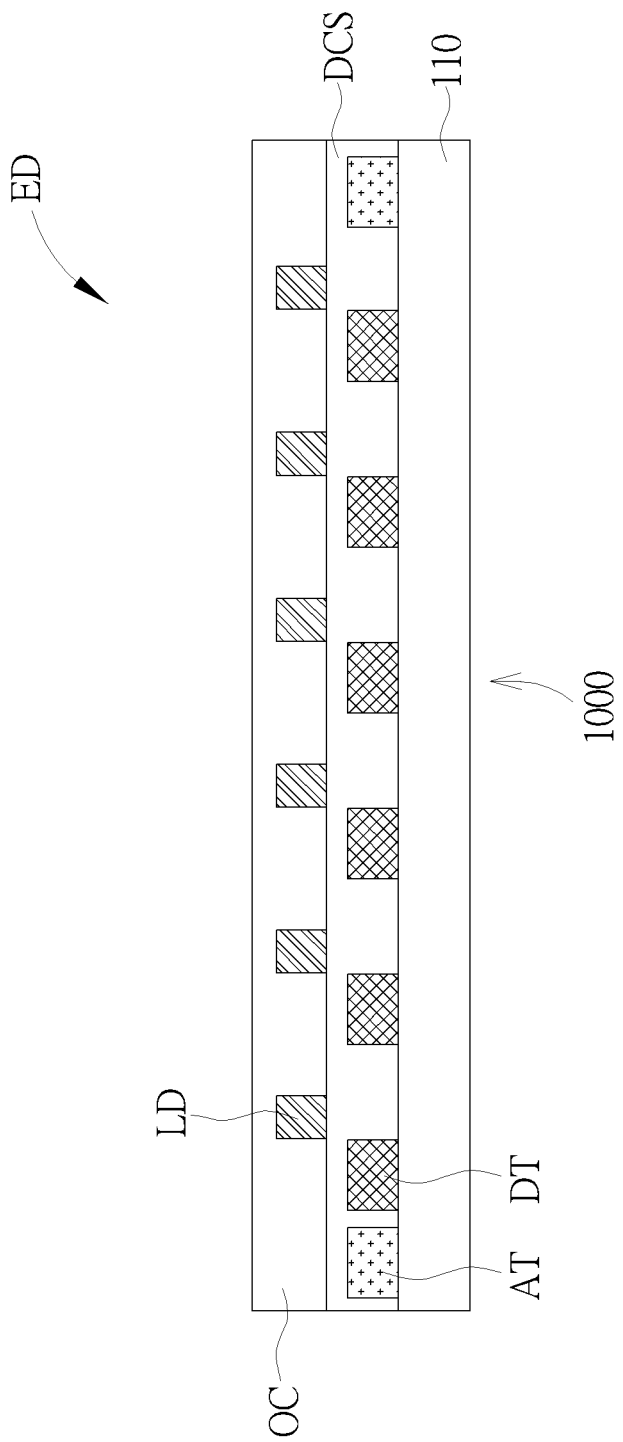
FIG. 19 is a schematic diagram showing a cross-sectional view of an electronic device according to a tenth embodiment of the present disclosure.

Referring to FIG. 19, FIG. 19 is a schematic diagram showing a cross-sectional view of an electronic device according to a tenth embodiment of the present disclosure, wherein the driving thin film transistor DT and the light emitting device LD shown in FIG. 19 may be the same as one of the above embodiments disclosed in the present disclosure or other suitable embodiments. As shown in FIG. 19, a difference between this embodiment and the first embodiment is that the electronic device ED may not have the backplane structure BS. Therefore, the integrated circuit IC (not shown in FIG. 19) and the assisting thin film transistor AT may be disposed inside the substrate structure 1000 or disposed at other suitable position. In an embodiment, after forming the substrate structure 1000 and the over coating layer OC, an encapsulating process may be performed on the substrate structure 1000 directly, but not limited thereto. In another embodiment, after forming the substrate structure 1000 and the over coating layer OC and before performing the encapsulating process, a covering plate may be disposed on the over coating layer OC.

Figure 20:
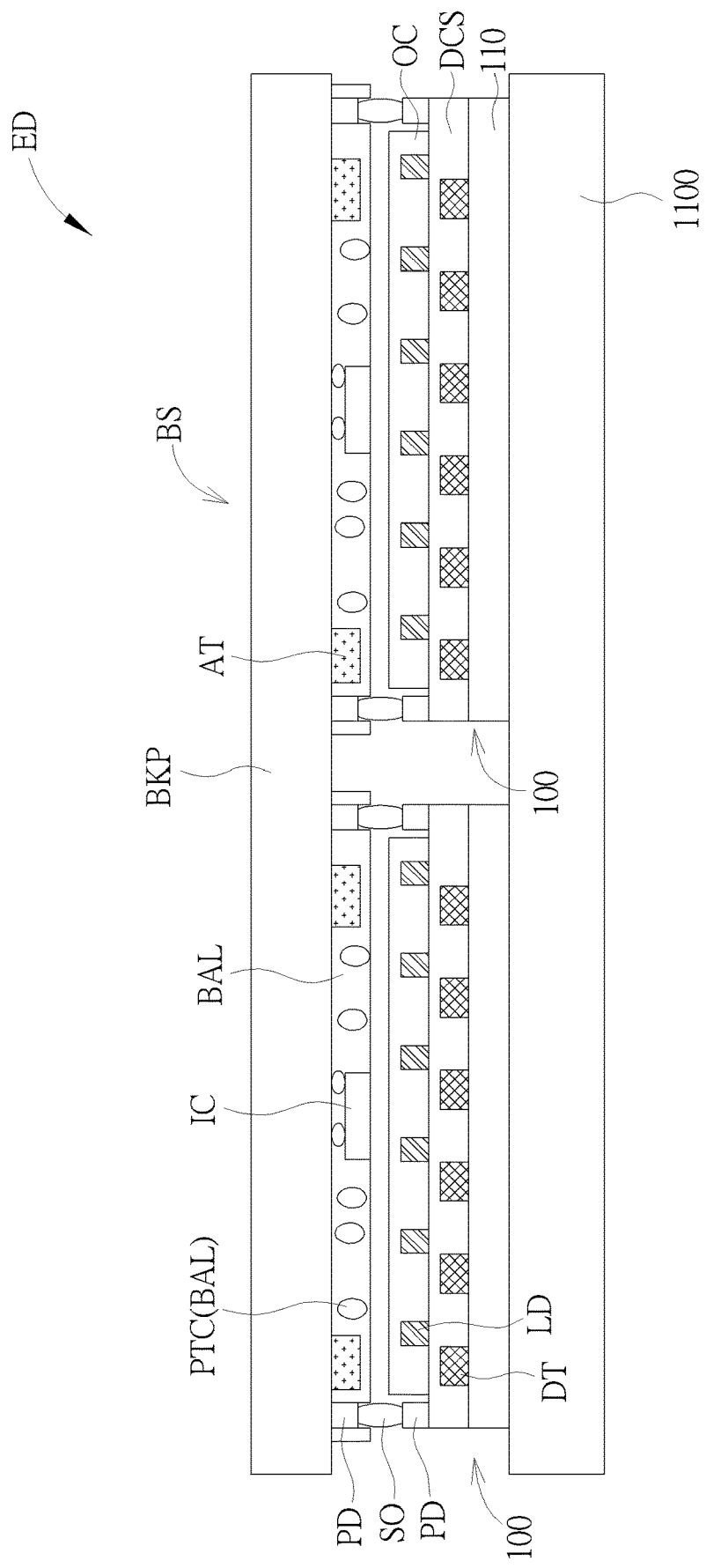
FIG. 20 is a schematic diagram showing a cross-sectional view of an electronic device according to an eleventh embodiment of the present disclosure.

Referring to FIG. 20, FIG. 20 is a schematic diagram showing a cross-sectional view of an electronic device according to an eleventh embodiment of the present disclosure, wherein the driving thin film transistor DT and the light emitting device LD shown in FIG. 20 may be the same as one of the above embodiments disclosed in the present disclosure or other suitable embodiments. For example, the substrate structure 100 shown in FIG. 20 is the same as the first embodiment. As shown in FIG. 20, a difference between this embodiment and the first embodiment is that the electronic device ED further includes a panel 1100. For example, if the electronic device ED is a display device, the panel 1100 is a display panel 1100, but not limited thereto. The panel 1100 may be disposed at a side of the substrate structure 100 or on the backplane BKP. For instance, in FIG. 20, because the light emitting device LD emits the light downward, the panel 1100 is disposed at a side of the substrate 110 opposite to the light emitting device LD, but not limited thereto. In this embodiment, the substrate structure 100 including the driving circuit structure DCS and the light emitting device LD is configured to be a component of a backlight module to provide backlight for the panel 1100. In another instance, the light emitting device LD may emit the light upward (e.g. the embodiment shown in FIG. 16, FIG. 17A or FIG. 17B), the panel 1100 is disposed on the backplane BKP or on the over coating layer OC, but not limited thereto.

In the substrate structure 100 configured to be the backlight module, the following features may be optionally included. With reference to FIG. 1 and other figures related to the previous embodiments, the channel layer CLd of the driving thin film transistor DT may not overlap with the light emitting layer 174 and/or the first connecting post CP1 of the light emitting device LD. The driving circuit structure DCS may further include the switching thin film transistor ST electrically connected to the driving thin film transistor DT. The driving circuit structure DCS may further include the capacitor Cpc electrically connected to the driving thin film transistor DT. The electronic device ED may further include the buffer layer 710 disposed on the light emitting device LD. The substrate structure 100 may further include the electrostatic discharge protection device ESD electrically connected to at least one of the first connecting post CP1 and the second connecting post CP2. The electronic device ED may further include the adhesive layer 160 disposed between the driving circuit structure DCS and the emitting device LD. The backplane structure BS including the backplane BKP and the integrated circuit IC is disposed on the substrate structure 100, wherein the integrated circuit IC and the at least one light emitting device LD are situated between the backplane BKP and the substrate 110, and the integrated circuit IC is electrically connected to the at least one driving thin film transistor DT. Moreover, the electronic device ED may further include other suitable components, for example, the electronic device ED may further include a light diffusion film for diffusing the backlight, or other optical films such as BEF, DBEF, lens, microlens, prism films, but not limited thereto. In other embodiments, the electronic device ED may further include wavelength conversion layer (not shown) disposed on the emitting device LD, such as phosphor, quantum dots, color filter, but not limited to.

To summarize, because the channel layer of the driving thin film transistor of the present disclosure has the channel length less than the distance between the first connecting post and the second connecting post, the driving current passing through the driving thin film transistor and configured to drive the light emitting device is increased even though the light emitting area is larger. Accordingly, the performance of the electronic device may be improved and/or the cost of the electronic device may be reduced.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A display device, comprising:
  a substrate;
  a driving circuit structure disposed on the substrate and having at least one driving thin film transistor; and
  at least one light emitting device having a first connecting post and a second connecting post thereby being disposed on the driving circuit structure, and the at least one light emitting device electrically connected to the at least one driving thin film transistor through the first connecting post, wherein the at least one light emitting device further comprises a light emitting layer and two conductive connecting structures, the first connecting post is electrically connected to one of the two conductive connecting structures, the second connecting post is electrically connected to another one of the two conductive connecting structures, topmost surfaces of the two conductive connecting structures are both on a first side of the light emitting layer, and the first connecting post and the second connecting post are both on a second side of the light emitting layer opposite to the first side;
  wherein the at least one driving thin film transistor comprises a channel layer, and a distance between the first connecting post and the second connecting post is greater than a channel length of the channel layer.

2. The display device according to claim 1, wherein the light emitting layer does not overlap with the channel layer.

3. The display device according to claim 1, wherein the channel layer does not overlap with the first connecting post.

4. The display device according to claim 1, wherein the driving circuit structure further comprises at least one switching thin film transistor electrically connected to the at least one driving thin film transistor.

5. The display device according to claim 1, wherein the driving circuit structure further comprises a capacitor electrically connected to the at least one driving thin film transistor.

6. The display device according to claim 1, further comprising an electrostatic discharge protection device electrically connected to one of the first connecting post and the second connecting post.

7. The display device according to claim 1, further comprising an adhesive layer disposed on the driving circuit structure, wherein the adhesive layer is in contact with the at least one light emitting device.

8. The display device according to claim 1, further comprises a buffer layer disposed on the at least one light emitting device.

9. The display device according to claim 1, further comprising a backplane and an integrated circuit, wherein the integrated circuit and the at least one light emitting device are situated between the backplane and the substrate, and the integrated circuit is electrically connected to the at least one driving thin film transistor.

10. A backlight module, comprising:
a substrate;
a driving circuit structure disposed on the substrate and having at least one driving thin film transistor; and
at least one light emitting device having a first connecting post and a second connecting post thereby being disposed on the driving circuit structure, and the at least one light emitting device electrically connected to the at least one driving thin film transistor through the first connecting post, wherein the at least one light emitting device further comprises a light emitting layer and two conductive connecting structures, the first connecting post is electrically connected to one of the two conductive connecting structures, the second connecting post is electrically connected to another one of the two conductive connecting structures, topmost surfaces of the two conductive connecting structures are both on a first side of the light emitting layer, and the first connecting post and the second connecting post are both on a second side of the light emitting layer opposite to the first side;
wherein the at least one driving thin film transistor comprises a channel layer, and a distance between the first connecting post and the second connecting post is greater than a channel length of the channel layer.

11. The backlight module according to claim 10, wherein the light emitting layer does not overlap with the channel layer.

12. The backlight module according to claim 10, wherein the channel layer does not overlap with the first connecting post.

13. The backlight module according to claim 10, wherein the driving circuit structure further comprises at least one switching thin film transistor electrically connected to the at least one driving thin film transistor.

14. The backlight module according to claim 10, wherein the driving circuit structure further comprises a capacitor electrically connected to the at least one driving thin film transistor.

15. The backlight module according to claim 10, further comprising an electrostatic discharge protection device electrically connected to one of the first connecting post and the second connecting post.

16. The backlight module according to claim 10, further comprising an adhesive layer disposed on the driving circuit structure, wherein the adhesive layer is in contact with the at least one light emitting device.

17. The backlight module according to claim 10, wherein further comprises a buffer layer disposed on the at least one light emitting device.

18. The backlight module according to claim 10, further comprising a backplane and an integrated circuit, wherein the integrated circuit and the at least one light emitting device are situated between the backplane and the substrate, and the integrated circuit is electrically connected to the at least one driving thin film transistor.

19. An electronic device, comprising:
a substrate;
a driving circuit structure disposed on the substrate and having at least one driving thin film transistor; and
at least one light emitting device having a first connecting post and a second connecting post thereby being disposed on the driving circuit structure, and the at least one light emitting device electrically connected to the at least one driving thin film transistor through the first connecting post, wherein the at least one light emitting device further comprises a light emitting layer and two conductive connecting structures, the first connecting post is electrically connected to one of the two conductive connecting structures, the second connecting post is electrically connected to another one of the two conductive connecting structures, topmost surfaces of the two conductive connecting structures are both on a first side of the light emitting layer, and the first connecting post and the second connecting post are both on a second side of the light emitting layer opposite to the first side;
wherein the at least one driving thin film transistor comprises a channel layer, and a distance between the first connecting post and the second connecting post is greater than a channel length of the channel layer.

20. The electronic device according to claim 19, further comprising a panel, wherein the driving circuit structure and the at least one light emitting device are configured to be a portion of a backlight module to provide backlight for the panel.

* * * * *